(12) United States Patent
Ohnuma et al.

(10) Patent No.: US 7,858,495 B2
(45) Date of Patent: Dec. 28, 2010

(54) METHOD FOR MANUFACTURING SOI SUBSTRATE

(75) Inventors: Hideto Ohnuma, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 146 days.

(21) Appl. No.: 12/359,367

(22) Filed: Jan. 26, 2009

(65) Prior Publication Data

US 2009/0197391 A1 Aug. 6, 2009

(30) Foreign Application Priority Data

Feb. 4, 2008 (JP) .............................. 2008-024608

(51) Int. Cl.
*H01L 21/30* (2006.01)
(52) U.S. Cl. ................... 438/458; 438/149; 438/150; 438/455; 438/459; 438/479; 438/528; 257/347
(58) Field of Classification Search ......... 438/149–150, 438/455, 458–459, 479, 528; 257/347
See application file for complete search history.

(56) References Cited

U.S. PATENT DOCUMENTS

| | | | |
|---|---|---|---|
| 5,374,564 | A | 12/1994 | Bruel |
| 6,380,046 | B1 | 4/2002 | Yamazaki |
| 6,566,233 | B2 * | 5/2003 | Yokokawa et al. .......... 438/455 |
| RE39,484 | E | 2/2007 | Bruel |
| 7,199,024 | B2 | 4/2007 | Yamazaki |
| 2006/0154442 | A1 * | 7/2006 | de Souza et al. ............ 438/455 |
| 2007/0032043 | A1 * | 2/2007 | Endo et al. ................... 438/459 |
| 2007/0173000 | A1 | 7/2007 | Yamazaki |
| 2008/0038900 | A1 * | 2/2008 | Thakur et al. ................ 438/455 |
| 2008/0061301 | A1 | 3/2008 | Yamazaki |
| 2008/0067529 | A1 | 3/2008 | Yamazaki |
| 2008/0067597 | A1 | 3/2008 | Yamazaki |
| 2008/0083953 | A1 | 4/2008 | Yamazaki |
| 2008/0213953 | A1 | 9/2008 | Yamazaki |

(Continued)

FOREIGN PATENT DOCUMENTS

JP 05-211128 8/1993

(Continued)

*Primary Examiner*—Kevin M Picardat
*Assistant Examiner*—Bac H Au
(74) *Attorney, Agent, or Firm*—Eric J. Robinson; Robinson Intellectual Property Law Office, P.C.

(57) ABSTRACT

A method for manufacturing an SOI substrate is provided in which adhesiveness between a single crystal semiconductor substrate and a semiconductor substrate is improved; bonding defects are reduced; and sufficient bonding strength is provided in a bonding step and also in a process of manufacturing a semiconductor device. An insulating film including halogen is formed on a single crystal semiconductor substrate side in which an embrittlement layer is formed. The insulating film including halogen undergoes a plasma treatment. The insulating film including halogen and a face of a semiconductor substrate are bonded so as to face each other. A thermal treatment is performed to split the single crystal semiconductor substrate along the embrittlement layer, thereby separating the single crystal semiconductor substrate into a single crystal semiconductor substrate and the semiconductor substrate to which a single crystal semiconductor layer is bonded. The single crystal semiconductor layer bonded to the semiconductor substrate undergoes a planarization treatment.

40 Claims, 17 Drawing Sheets

U.S. PATENT DOCUMENTS

2008/0246109 A1 10/2008 Ohnuma et al.
2008/0261379 A1 10/2008 Jinbo et al.
2008/0268263 A1 10/2008 Yamazaki
2008/0286941 A1 11/2008 Yamazaki
2008/0286942 A1 11/2008 Yamazaki
2008/0286956 A1 11/2008 Yamazaki

FOREIGN PATENT DOCUMENTS

JP 2000-012864 1/2000

* cited by examiner

FIG. 2A-1
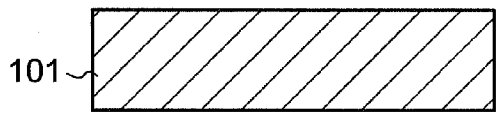
FIG. 2A-2
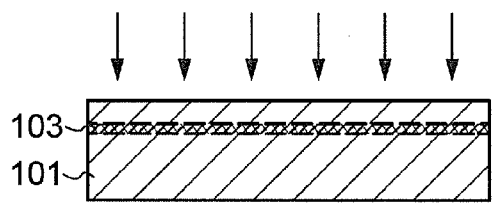
FIG. 2B-1
FIG. 2B-2
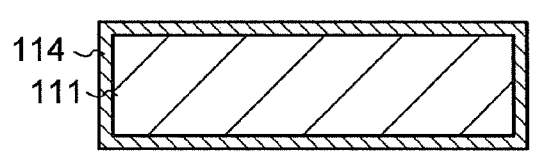
FIG. 2B-3
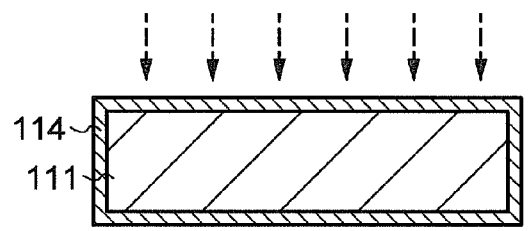
FIG. 2C
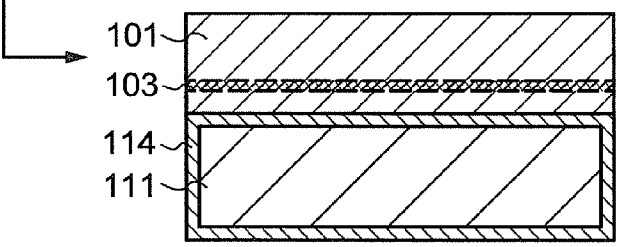
FIG. 2D
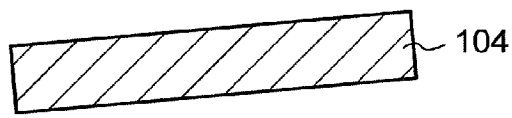
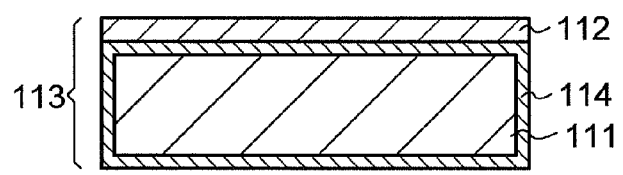

FIG. 3A-1
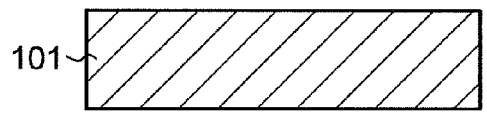
FIG. 3A-2
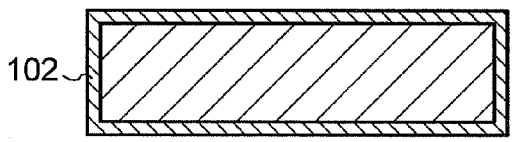
FIG. 3A-3
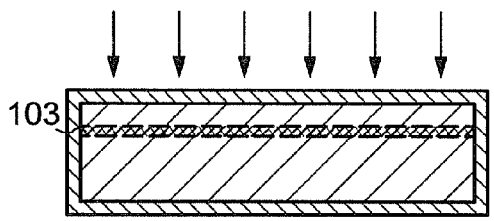
FIG. 3A-4
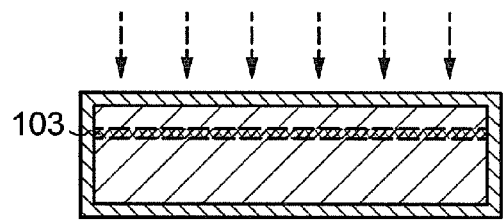
FIG. 3B-1
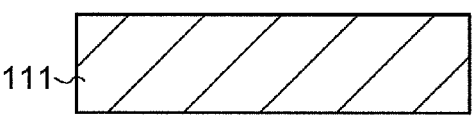
FIG. 3B-2
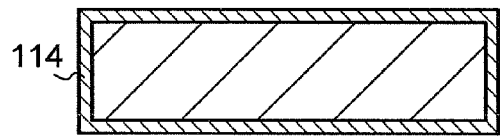
FIG. 3C
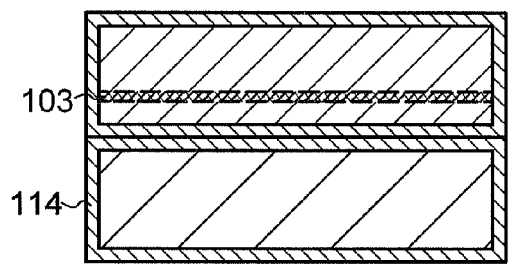
FIG. 3D
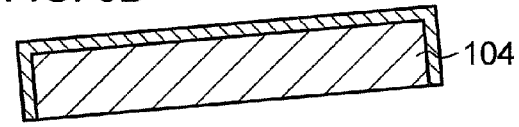
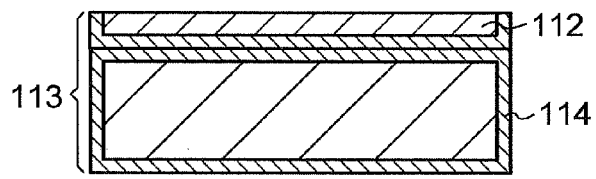

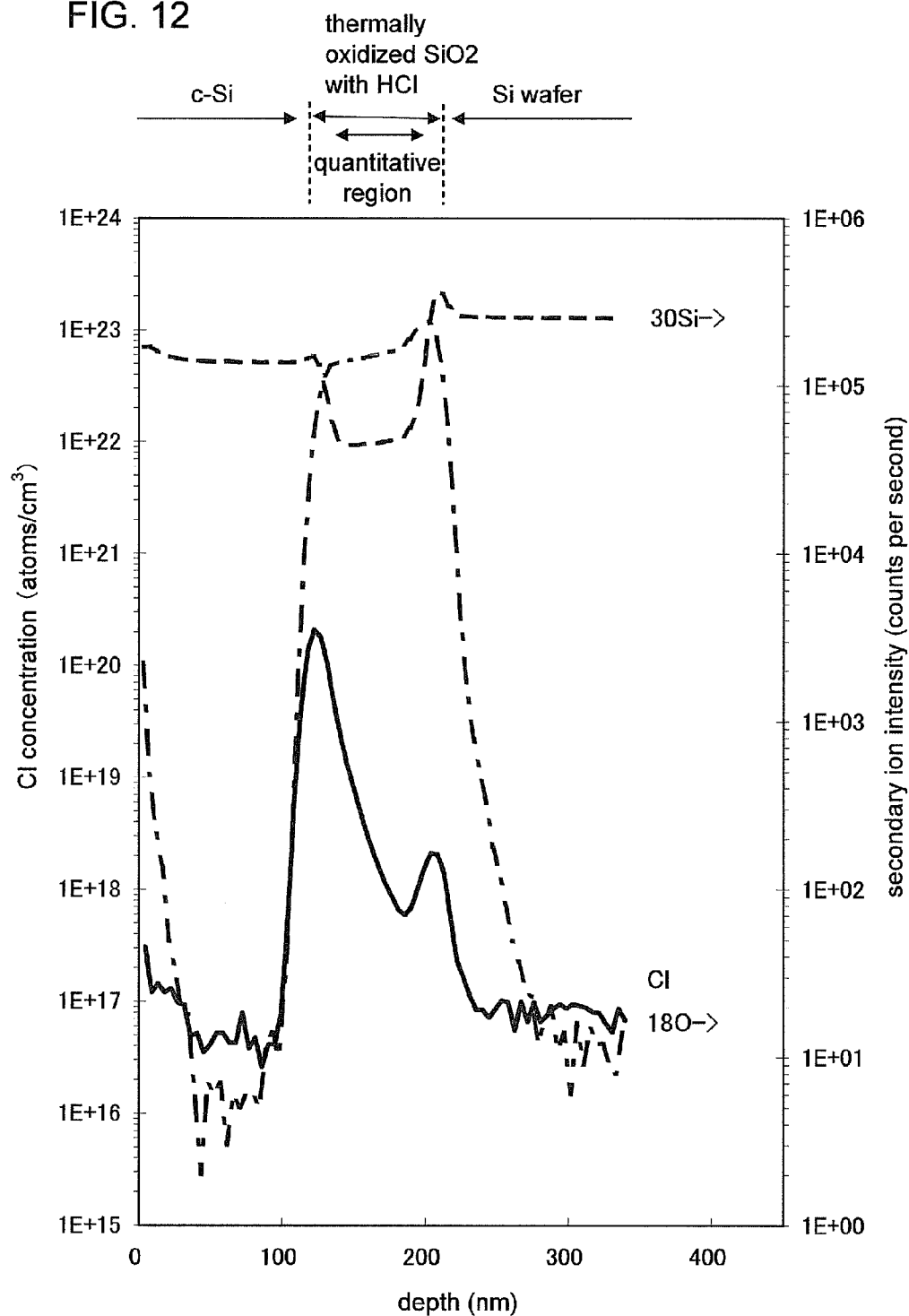

METHOD FOR MANUFACTURING SOI SUBSTRATE

BACKGROUND OF THE INVENTION

1. Field of the Invention

The present invention relates to a semiconductor device having a semiconductor layer formed over an insulating layer, and to a method for manufacturing the semiconductor device.

2. Description of the Related Art

In recent years, an integrated circuit has been developed in which an SOI (silicon on insulator) substrate is used instead of a bulk silicon wafer. By taking advantage of properties of a thin single crystal silicon layer formed over an insulating layer, a semiconductor layer in transistors in an integrated circuit can be separated completely, and the transistors can be a complete depletion type; thus, a semiconductor integrated circuit with high added value such as high integration, high-speed driving, or low power consumption can be realized.

As an SOI substrate, a SIMOX substrate and a bonding substrate are known. For example, in a SIMOX substrate, an SOI structure is achieved by implanting oxygen ions into a single crystal silicon substrate and performing a thermal treatment at 1300° C. or more to form a buried oxide (BOX) film, thereby forming a thin single crystal silicon film at a surface of the single crystal silicon substrate.

In a bonding substrate, two single crystal silicon substrates (a base substrate and a bond substrate) are bonded to each other with an oxide film interposed therebetween, and one of the single crystal silicon substrates (the bond substrate) is thinned from a rear face (a face which is not bonded), whereby a thin single crystal silicon film is formed to obtain an SOI structure. Since it is difficult to form a thin and uniform single crystal silicon film by grinding or polishing, a technique utilizing hydrogen ion implantation called the "Smart Cut" (registered trademark) is proposed (for example, see Reference 1: Japanese Published Patent Application No. H5-211128).

A summary of the method for manufacturing an SOI substrate is as follows: hydrogen ions are implanted into a single crystal silicon substrate by an ion implantation method, thereby forming an embrittlement layer at a given depth from a surface of the single crystal silicon substrate; next, another single crystal silicon substrate, which functions as a base substrate, is oxidized to form a silicon oxide film; after that, the single crystal silicon substrate into which the hydrogen ions are implanted and the silicon oxide film of the single crystal silicon substrate which functions as the base substrate are bonded to each other, so that the two single crystal silicon substrates are bonded to each other; subsequently, the single crystal silicon substrate is separated along the embrittlement layer through a thermal treatment, whereby a substrate is formed in which a thin single crystal silicon layer is bonded to the single crystal silicon substrate which functions as the base substrate.

The ion implantation method is also called an "ion introduction method"; in the ion implantation method, particles to be implanted into a sample are ionized in a vacuum and are accelerated with direct current or high-frequency waves, to be implanted into the sample. An ion implantation apparatus utilizing an ion implantation method includes an ion source, a mass separation portion, an acceleration portion, a beam scan portion (electrostatic scan), an implantation chamber (an end station), and a vacuum evacuation unit. Since an ion beam has a nonuniform cross section, a sample is scanned electrically with an ion beam so that the ion beam can be uniform on a surface of the sample. Implanted particles exhibit Gaussian distribution in a depth direction.

Further, an example of a semiconductor device utilizing an SOI substrate is disclosed in which hydrogen is implanted by an ion implantation method (see Reference 2: Japanese Published Patent Application No. 2000-012864).

In a process of bonding two single crystal silicon substrates, however, if minute foreign matters (e.g., particles) attach to a bonding interface between the single crystal silicon substrates, a large number of voids are generated, which increases bonding defects.

Further, if water molecules at the bonding interface between the single crystal silicon substrates are not diffused or absorbed into surroundings, water accumulates at the bonding interface, which increases bonding defects. Furthermore, a dehydration condensation reaction does not proceed at the bonding interface, so that a strong bond is not formed and there occurs a bonding defect.

If there frequently occur such bonding defects, the bonding strength decreases and a thin single crystal silicon layer can come to be unstuck at the bonding interface between the single crystal silicon substrate which functions as the base substrate and the thin single crystal silicon layer which has been separated. Further, also in manufacturing a semiconductor device, such bonding defects hinder manufacture of a semiconductor device having high quality.

SUMMARY OF THE INVENTION

In view of the above problems, an object of the present invention is to improve adhesiveness between a single crystal semiconductor layer and a semiconductor substrate, and to reduce bonding defects. Further, another object is to provide a method for manufacturing an SOI substrate having sufficient bonding strength in a bonding step and also in a process of manufacturing a semiconductor device.

An aspect of the present invention disclosed herein is to form an insulating film including halogen on a single crystal semiconductor substrate side in which an embrittlement layer is formed, perform a plasma treatment on the insulating film including halogen, and bond the insulating film including halogen and a face of a semiconductor substrate so as to face each other.

Another aspect of the present invention disclosed herein is to form an insulating film including halogen on a surface of a single crystal semiconductor substrate by performing a thermal oxidation treatment on the single crystal semiconductor substrate in an atmosphere including halogen; form an embrittlement layer in the single crystal semiconductor substrate by irradiating the single crystal semiconductor substrate with ions through the insulating film including halogen; perform a plasma treatment on the insulating film including halogen by applying a bias voltage thereto; bond the insulating film including halogen and a face of a semiconductor substrate so as to face each other; split the single crystal semiconductor substrate along the embrittlement layer by performing a thermal treatment, whereby the single crystal semiconductor substrate is separated into the semiconductor substrate to which a single crystal semiconductor layer is bonded and a single crystal semiconductor substrate; and perform a planarization treatment on the single crystal semiconductor layer bonded to the semiconductor substrate.

Another aspect of the present invention disclosed herein is to form an embrittlement layer in a single crystal semiconductor substrate by irradiating the single crystal semiconductor substrate with ions; form an insulating film including halogen on a surface of a semiconductor substrate by performing a thermal oxidation treatment on the semiconductor substrate in an atmosphere including halogen; perform a plasma treatment on the insulating film including halogen by applying a bias voltage thereto; bond the insulating film including halogen and a face of the single crystal semiconductor substrate so as to face each other; split the single crystal semiconductor substrate along the embrittlement layer by performing a thermal treatment, whereby the single crystal semiconductor substrate is separated into the semiconductor substrate to which a single crystal semiconductor layer is bonded and a single crystal semiconductor substrate; and perform a planarization treatment on the single crystal semiconductor layer bonded to the semiconductor substrate.

Another aspect of the present invention disclosed herein is to form an insulating film including halogen on a surface of a single crystal semiconductor substrate by performing a thermal oxidation treatment on the single crystal semiconductor substrate in an atmosphere including halogen; form an embrittlement layer in the single crystal semiconductor substrate by irradiating the single crystal semiconductor substrate with ions through the insulating film including halogen; perform a plasma treatment on the insulating film including halogen by applying a bias voltage thereto; form an insulating film on a surface of a semiconductor substrate by performing a thermal oxidation treatment on the surface of the semiconductor substrate; bond the insulating film including halogen and a face of the semiconductor substrate so as to face each other; split the single crystal semiconductor substrate along the embrittlement layer by performing a thermal treatment, whereby the single crystal semiconductor substrate is separated into the semiconductor substrate to which a single crystal semiconductor layer is bonded and a single crystal semiconductor substrate; and perform a planarization treatment on the single crystal semiconductor layer bonded to the semiconductor substrate.

Another aspect of the present invention disclosed herein is to form an insulating film on a surface of a single crystal semiconductor substrate by performing a thermal oxidation treatment on the single crystal semiconductor substrate; form an embrittlement layer in the single crystal semiconductor substrate by irradiating the single crystal semiconductor substrate with ions through the insulating film; form an insulating film including halogen on a surface of a semiconductor substrate by performing a thermal oxidation treatment on the semiconductor substrate in an atmosphere including halogen; perform a plasma treatment on the insulating film including halogen by applying a bias voltage thereto; bond the insulating film including halogen and a face of the single crystal semiconductor substrate so as to face each other; split the single crystal semiconductor substrate along the embrittlement layer by performing a thermal treatment, whereby the single crystal semiconductor substrate is separated into the semiconductor substrate to which a single crystal semiconductor layer is bonded and a single crystal semiconductor substrate; and perform a planarization treatment on the single crystal semiconductor layer bonded to the semiconductor substrate.

In this specification, a "single crystal" means a crystal which has aligned crystal faces or aligned crystal axes and in which atoms or molecules constituting the crystal are arranged in a spatially regular manner. Although atoms or molecules are arranged in a regular manner in a single crystal, a single crystal includes a crystal which partly has a lattice defect, in which the alignment is disordered, and a crystal which has intended or unintended lattice distortion in its category.

In the above, a feature is that the insulating film including halogen is an insulating film that mainly contains silicon oxide; further, the insulating film including halogen includes halogen at a concentration of $1\times10^{16}$ atoms/cm$^3$ to $2\times10^{21}$ atoms/cm$^3$; furthermore, the halogen is chlorine.

In the above, another feature is that oxygen is used as a gas for the plasma treatment.

Note that an "average surface roughness" (Ra) in this specification refers to a centerline average roughness obtained by three-dimensionally expanding a centerline average roughness defined by JIS B0601 so as to be applied to a plane to be measured. The Ra can be expressed as an "average value of absolute values of deviations from a reference plane to a designated plane, and is defined with the following formula (1):

$$R_a = \frac{1}{S_0} \int_{y1}^{y2} \int_{x1}^{x2} |f(x, y) - Z_0| dx dy \tag{1}$$

In the formula (1), $S_0$ represents an area of a plane to be measured (a rectangular region which is defined by four points represented by coordinates $(x_1, y_1)$, $(x_1, y_2)$, $(x_2, y_2)$, and $(x_2, y_2)$), and $Z_0$ represents an average height of the plane to be measured.

Moreover, a maximum height difference (P–V) refers to a difference between a height $Z_{max}$ of the highest point and a height $Z_{min}$ of the lowest point in the plane to be measured.

In this specification, a "semiconductor device" means a device in general which can function by utilizing semiconductor characteristics; electrooptic devices, semiconductor circuits, and electronic devices are all included in a category of the semiconductor device.

Further, in this specification, a display device includes a liquid crystal display device and a light-emitting device in its category. A liquid crystal display device has a liquid crystal element and a light-emitting device has a light-emitting element. A light-emitting element includes, in its category, an element whose luminance is controlled with current or voltage; specifically, an organic electroluminescent (EL) element and an inorganic EL element.

According to the present invention disclosed herein, an SOI substrate can be manufactured in which adhesiveness between a single crystal semiconductor layer and a semiconductor substrate is improved; bonding defects are reduced; and sufficient bonding strength is provided in a bonding step and also in a process of manufacturing a semiconductor device.

BRIEF DESCRIPTION OF THE DRAWINGS

In the accompanying drawings:

FIGS. 2A-1 and 2A-2, FIGS. 2B-1 to 2B-3, and FIGS. 2C and 2D are drawings illustrating an example of a method for manufacturing an SOI substrate;

FIGS. 3A-1 to 3A-4, FIGS. 3B-1 and 3B-2, and FIGS. 3C and 3D are drawings illustrating an example of a method for manufacturing an SOI substrate;

FIGS. 4A-1 to 4A-5, FIGS. 4B-1 and 4B-2, and FIGS. 4C and 4D are drawings illustrating an example of a method for manufacturing an SOI substrate;

FIG. 12 is a graph showing a depth profile of a chlorine concentration in a silicon oxide film which is measured with SIMS;

DETAILED DESCRIPTION OF THE INVENTION

Figures 1, 1A:
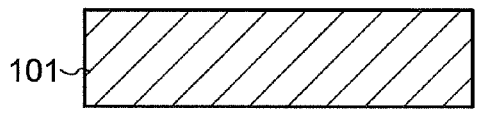
FIGS. 1A-1 to 1A-4 and FIGS. 1B, 1C, and 1D are drawings illustrating an example of a method for manufacturing an SOI substrate.

Hereinafter, embodiment modes are described with reference to the drawings. Note that the present invention can be carried out in many different modes and it is easily understood by those skilled in the art that the modes and details disclosed herein can be modified without departing from the spirit and scope of the present invention. Therefore, the present invention should not be interpreted as being limited to the description of the embodiment modes to be given below. In all the drawings for illustrating the embodiment modes, the same reference numeral is given to the same parts or parts having similar functions, and repeated description thereof is omitted.

Embodiment Mode 1

This embodiment mode describes an example of a method for manufacturing an SOI substrate with reference to the drawings. Specifically, a method is described in which a Si-based insulating film is formed on a single crystal semiconductor substrate side; the insulating film undergoes an $O_2$ plasma treatment; then, the single crystal semiconductor substrate and a semiconductor substrate are bonded to each other.

First, a single crystal semiconductor substrate 101 is prepared, and is cleaned with a sulfuric acid/hydrogen peroxide mixture (SPM), an ammonia/hydrogen peroxide mixture (APM), a hydrochloric acid/hydrogen peroxide mixture (HPM), dilute hydrofluoric acid (DHF), ozone water, or the like as appropriate (see FIG. 1A-1). For the single crystal semiconductor substrate 101, a commercial single crystal semiconductor substrate can be used; for example, a single crystal silicon substrate, a single crystal germanium substrate, or a compound semiconductor substrate such as a gallium arsenide substrate or an indium phosphide substrate can be used. Typical examples of a commercial silicon substrate are circular substrates having diameters of 5 inches (125 mm), 6 inches (150 mm), 8 inches (200 mm), 12 inches (300 mm), and 18 inches (450 mm). The shape of the substrate is not limited to a circle, and a silicon substrate processed to have a rectangular shape or the like can also be used. Hereinafter, a case is described where a single crystal silicon substrate is used as the single crystal semiconductor substrate 101.

Next, the single crystal semiconductor substrate 101 undergoes a thermal treatment in an oxidation atmosphere (hereinafter also referred to as a "thermal oxidation atmosphere"), whereby an insulating film 102 is formed (see FIG. 1A-2). Although general dry oxidation may be performed as the thermal oxidation treatment, it is preferable to perform oxidation in which halogen is added to an oxidation atmosphere. By performing oxidation in which halogen is added to an oxidation atmosphere, halogen can be included in the insulating film 102. As a gas for adding halogen to an oxidation atmosphere, HCl can be used. As an example of such a thermal oxidation treatment, it is preferable to perform thermal oxidation at 900° C. to 1150° C. (typically 1000° C.) in an atmosphere including HCl at 0.5 to 10 volume % (more preferably 3 volume %) with respect to oxygen. It is preferable that the treatment time be 0.1 to 6 hours, more preferably 0.5 to 1 hour. The insulating film 102 is formed with a thickness of 10 nm to 1000 nm (preferably 50 nm to 300 nm), e.g., 200 nm.

A thermal treatment at temperatures in the above range can provide a gettering effect due to halogen (e.g., chlorine) for the single crystal semiconductor substrate 101. As the gettering effect, an effect of removing a metal impurity can be produced. That is, with action of halogen, an impurity such as a metal turns into volatile halide and is released into air, to be removed from the single crystal semiconductor substrate 101. It is effective on the single crystal semiconductor substrate 101 which has undergone chemical mechanical polishing (CMP).

As the gas for adding halogen to the oxidation atmosphere which is applied to the thermal oxidation treatment, one or more of HF, $NF_3$, HBr, $Cl_2$, t-DCE (trans-1,2-dichloroethylene), $ClF_3$, $BCl_3$, $F_2$, $Br_2$, and the like can be used instead of HCl. Instead of trans-1,2-dichloroethylene, cis-1,2-dichloroethylene, 1,1-dichloroethylene, or a mixed gas of two or more kinds of the above may also be used.

Further, halogen is included in the insulating film 102 which is formed by undergoing thermal oxidation with halogen added; when halogen is included in the insulating film 102 at a concentration of $1 \times 10^{16}$ atoms/cm$^3$ to $2 \times 10^{21}$ atoms/cm$^3$ inclusive, the insulating film 102 can function as a protective film for trapping impurities such as a metal and preventing the single crystal semiconductor substrate 101 from being contaminated.

Further, in the halogen included in the insulating film 102, fluorine can also be included in addition to chlorine. In such a case, it is preferable that fluorine be included in a smaller amount than chlorine.

Subsequently, the single crystal semiconductor substrate 101 is irradiated with ions through the insulating film 102 to introduce the ions into the single crystal semiconductor substrate 101, so that an embrittlement layer 103 is formed in a region at a predetermined depth from one face of the single crystal semiconductor substrate 101 (see FIG. 1A-3).

The depth at which the embrittlement layer 103 is formed can be controlled with the ion species, or the kinetic energy or incidence angle of the ions. The kinetic energy can be controlled with the acceleration voltage or the like. The acceleration energy can be controlled with the acceleration voltage or the like. The embrittlement layer 103 is formed in a region at a depth equal to or almost equal to the average penetration depth of the ions. The thickness of a single crystal semiconductor layer that is separated from the single crystal semiconductor substrate 101 in a later step is determined with the depth to which the ions are introduced. The embrittlement layer 103 is formed at a depth of 10 nm to 500 nm inclusive, preferably 50 nm to 200 nm inclusive.

In introducing the ions into the single crystal semiconductor substrate 101, an ion doping apparatus can be used. When an ion doping apparatus is used, a source gas is excited to produce plasma, and ions extracted from the plasma are introduced into an object without mass separation of the ions. With the use of an ion doping apparatus, the single crystal semiconductor substrate 101 can be doped uniformly. When an ion doping apparatus provided with a mass separation unit is used, ion implantation, which is accompanied by mass separation, can be performed.

When an ion doping method is used, a hydrogen gas, a rare gas, or the like can be given as a source gas used in adding the ions; in this embodiment mode, it is preferable to use a hydrogen gas. When a hydrogen gas is used as the source gas, ions generated are $H^+$, $H_2^+$, and $H_3^+$; it is preferable that $H_3^+$ be introduced at the highest percentage. Introduction efficiency of hydrogen atoms in utilizing $H_3^+$ is superior to that in utilizing $H^+$ or $H_2^+$, and introduction time can be shortened. Further, in a later step, a crack can easily be generated in the embrittlement layer 103.

When an ion doping method is used, ions are introduced with an ion doping apparatus without mass separation; thus, metal ions can also be introduced into the single crystal semiconductor substrate 101 in addition to hydrogen ions at the same time. Since a metal ion has a large mass number, there are a number of metal ions in a surface on the ion introduction side. In this embodiment mode, the insulating film 102 is formed on the surface of the single crystal semiconductor substrate 101. By forming the insulating film 102 with a larger thickness than a depth to which the metal ions are introduced, distribution of the metal ions can be confined within the insulating film 102. By including halogen, the insulating film 102 has an effect of gettering an impurity, such as a heavy metal, which has an adverse influence on the single crystal semiconductor substrate 101. Accordingly, the impurity trapped can be fixed in the insulating film 102, which can prevent the single crystal semiconductor substrate 101 from being contaminated.

Next, the insulating film 102 undergoes a plasma treatment by applying a bias voltage thereto (see FIG. 1A-4).

The plasma treatment is performed in plasma which is produced by introducing an inert gas (e.g., an argon (Ar) gas) and/or a reactive gas (e.g., an oxygen ($O_2$) gas or a nitrogen ($N_2$) gas) into a chamber in a vacuum and applying a bias voltage to a face to be treated.

For example, when the plasma treatment is performed using an oxygen gas, an $O_2$ gas is introduced into a chamber in a vacuum and a bias voltage is applied to a face to be treated (in this example, the insulating film 102 formed on the single crystal semiconductor substrate 101) to produce plasma. There are oxygen cations in plasma, and the oxygen cations are accelerated in a direction of a cathode (the insulating film 102 formed on the single crystal semiconductor substrate 101). The accelerated oxygen cations collide with a surface of the insulating film 102, thereby cutting Si—O bonds in a surface layer of the insulating film 102 to reduce the density of the surface of the insulating film 102; thus, the surface of the insulating film 102 is damaged and dangling bonds are generated therein, so that the surface can be activated.

In this embodiment mode, a plasma treatment of a reactive ion etching (RIE) mode, which is a kind of capacitive coupling plasma, is performed using an oxygen gas. The plasma treatment is not limited to being performed with etching. The single crystal semiconductor substrate 101 is placed on a stage over a cathode electrode to which a high-frequency voltage is applied through a capacitor, and a high-frequency voltage is applied to produce plasma. As a result, negative bias is produced in the cathode electrode (bias is applied to the cathode electrode), and cations in the plasma are accelerated to collide with the single crystal semiconductor substrate 101. Instead of an RIE method, the plasma treatment may be performed on the surface of the insulating film by applying bias to the substrate side using plasma generated by an inductively-coupled plasma (ICP) method or a microwave excitation method.

Figure 16:
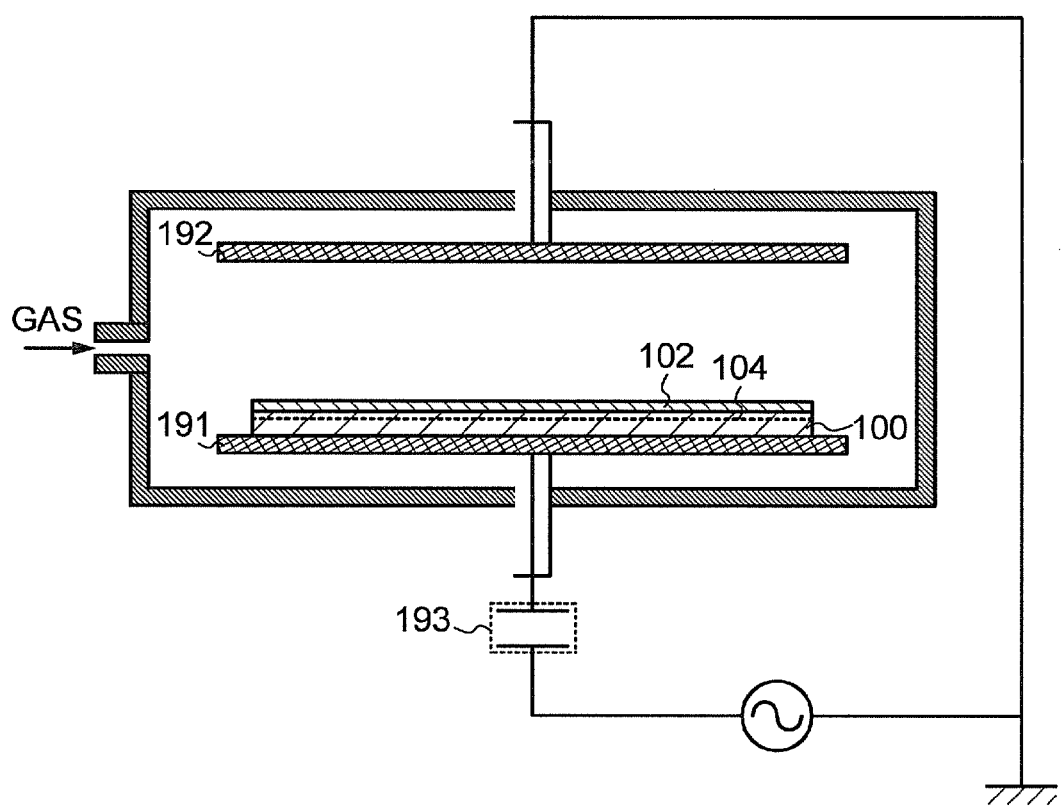
FIG. 16 is a drawing illustrating an example of a plasma treatment in a method for manufacturing an SOI substrate.

In this embodiment mode, a plasma treatment by a reactive ion etching (RIE) method, which is a kind of capacitive coupling plasma, can be performed using an oxygen gas (see FIG. 16). The single crystal semiconductor substrate 101 provided with the insulating film 102 is placed on a stage over a first electrode 191 that functions as a cathode to which a high-frequency voltage is applied through a capacitor 193, and a high-frequency voltage is applied to produce plasma between the first electrode 191 and a second electrode 192 that functions as an anode. As a result, negative self-bias is produced in the first electrode 191 (bias is applied to the first electrode 191), and cations in the plasma are accelerated to collide with the single crystal semiconductor substrate 101. The insulating film 102 formed on the single crystal semiconductor substrate 101 is formed of silicon oxide; therefore, with oxygen used as a source gas, etching action on the insulating film 102 can be reduced.

Specifically, oxygen plasma may be produced under the following condition: the electric power for the treatment is 0.15 W/cm² to 3 W/cm²; the pressure is 30 Pa to 130 Pa; and the gas ($O_2$) flow rate is 10 sccm to 200 sccm.

Further, it is preferable that the oxygen plasma treatment make the insulating film 102 have a surface roughness (Ra) of less than or equal to 0.5 nm, more preferably less than or equal to 0.3 nm, still more preferably less than or equal to 0.2 nm; and a maximum height difference (P–V) of less than or equal to 6 nm, more preferably less than or equal to 3 nm.

Figure 17:
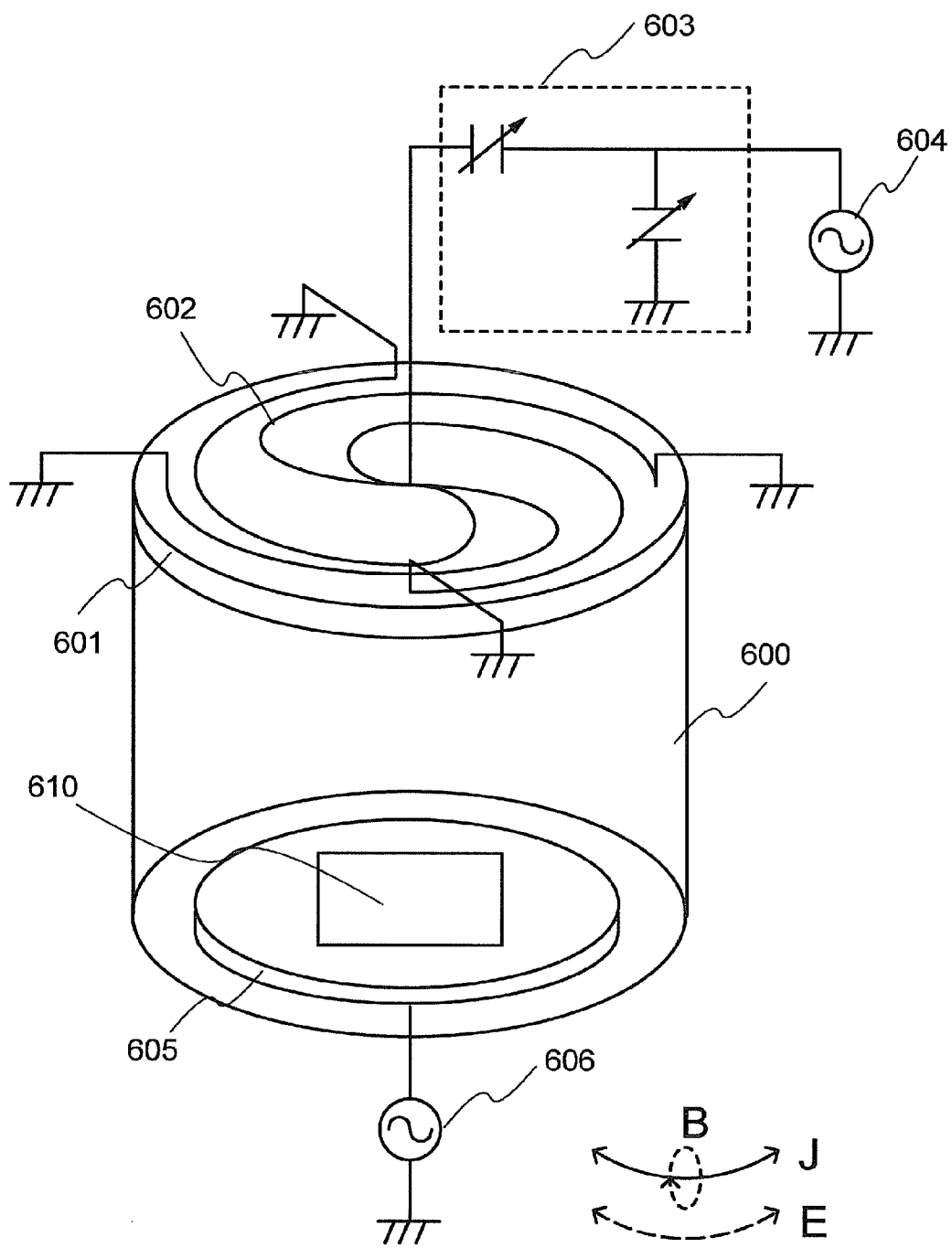
FIG. 17 is a drawing illustrating an example of a plasma treatment in a method for manufacturing an SOI substrate.

In this embodiment mode, a plasma treatment by an ICP method can also be performed using an argon gas. FIG. 17 is a simplified structural diagram of a plasma treatment apparatus. A multi-spiral coil 602 is provided over a quartz plate 601 in an upper portion of a chamber 600, and is connected to an RF power source 604 with a matching box 603 interposed therebetween. Further, a lower electrode 605 on a substrate 610 (in this example, the insulating film 102 formed on the single crystal semiconductor substrate 101) side that faces the multi-spiral coil 602 is connected to an RF power source 606. When an RF current is applied to the multi-spiral coil 602 over the substrate 610, an RF current J flows through the spiral coil 602 in a direction θ, so that a magnetic field B is produced in a direction Z.

$$\mu_0 J = \text{rot} B$$

An induction field E is produced in the direction θ by the Faraday's law of electromagnetic induction.

$$-\frac{\partial B}{\partial t} = rotE$$

Electrons are accelerated in the direction θ with this induction field E, and collide with molecules of the gas, whereby plasma is produced. A plasma region in which plasma with a high density spreads in a sheet-like form can be obtained because the magnetic field B is hardly produced on the substrate 610 side. Cations are accelerated with a bias voltage applied to the substrate 610 side, and collide with the substrate 610. Specifically, the condition may be set as follows: the ICP power is 300 W to 3000 W; the bias power is 10 W to 300 W; the pressure is 1 Pa to 10 Pa; the gas ($O_2$) flow rate is 10 sccm to 300 sccm.

Although the ion irradiation for forming the embrittlement layer 103 enables dangling bonds to be formed, a plasma treatment by applying a bias voltage makes it possible to form a larger number of dangling bonds. Further, by irradiating an outermost surface and a vicinity thereof of the insulating film 102, which include a large amount of hydrogen due to addition of hydrogen ions, Si—H bonds and Si—O bonds turn into Si—OH bonds to improve a hydrophilic property.

Figure 1B:
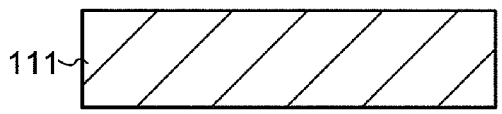

Then, a semiconductor substrate 111 for being bonded to the single crystal semiconductor substrate 101 is prepared (see FIG. 1B). For the semiconductor substrate 111, a similar substrate to the single crystal semiconductor substrate 101 can be used. Alternatively, a polycrystalline semiconductor substrate, a solar-grade silicon substrate (SOG-Si; e.g., a material having a Si purity of 99.9999%) that is used for manufacturing a solar battery, or the like can also be used. The polycrystalline semiconductor substrate is a wafer having a diameter of greater than or equal to 5 inches. The polycrystalline semiconductor substrate presented in this specification includes a polycrystalline silicon substrate, a polycrystalline compound semiconductor substrate, further, a polycrystalline silicon substrate including a slight amount of germanium, or a polycrystalline silicon substrate including a slight amount of boron in its category.

Furthermore, in order to bond the semiconductor substrate 111 and the insulating film 102 favorably, a bonding face may be activated in advance. For example, one or both of the faces to be bonded are irradiated with an atomic beam or an ion beam. When an atomic beam or an ion beam is utilized, an inert gas (e.g., argon) neutral atom beam or an inert gas ion beam can be used. Alternatively, the bonding face may be activated by performing plasma irradiation or a radical treatment. Such a surface treatment makes it easy to bond different kinds of materials even at a temperature of less than or equal to 400° C.

Figures 1, 1A, 2:
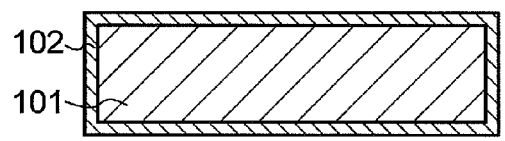
Figures 1, 1A, 2, 3:
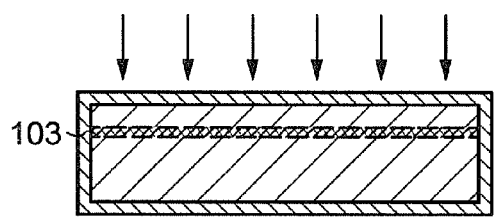
Figures 1, 1A, 2, 3, 4:
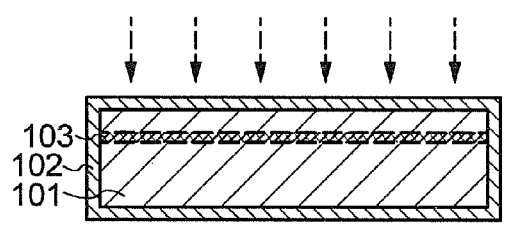
Figure 1C:
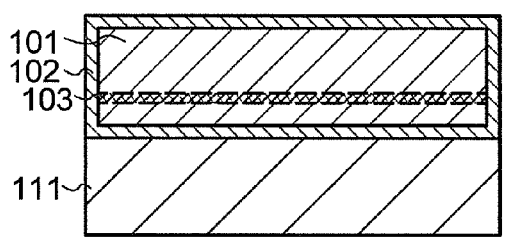

Next, the insulating film 102 including halogen (on the side in which the embrittlement layer is formed) and a face of the semiconductor substrate 111 are bonded so as to face each other (see FIG. 1C). By bringing the insulating film 102 including halogen in close contact with the semiconductor substrate 111, the substrates attract each other by van der Waals forces. Further, OH groups formed at the surface of the substrate bond to one another with hydrogen bonding. A thermal treatment at a low temperature (e.g., 150° C. to 200° C.) causes a dehydration condensation reaction to form a bond from which a water molecule is released and in which an oxygen atom is present between silicon atoms (Si—O—Si). By performing a thermal treatment at a higher temperature (e.g., 600° C.) further, oxygen is diffused and Si atoms bond to one another at an interface, so that the single crystal semiconductor substrate 101 and the semiconductor substrate 111 are bonded to each other more firmly.

By performing a plasma treatment on the insulating film 102 by applying a bias voltage thereto, the surface of the insulating film 102 is activated, in which dangling bonds are formed. By bonding the insulating film 102 and the semiconductor substrate 111 to each other with the surface activated, a strong bond can be formed even at a low temperature.

By cutting a Si—O bond, the structure is loosened and water is absorbed, so that the speed of diffusion is increased. Through the process of the thermal treatment at a low temperature after the bonding at a low temperature, a dehydration condensation reaction occurs (when a water molecule is released) and an excess water molecule is absorbed in the silicon oxide film, thereby promoting a dehydration reaction (at the bonding surface). Thus, a bonding strength improves even with a low-temperature treatment.

It is preferable that the insulating film 102 formed on the single crystal semiconductor substrate 101 and the semiconductor substrate 111 each undergo a surface treatment before bonding the single crystal semiconductor substrate 101 and the semiconductor substrate 111 to each other. As the surface treatment, an ozone treatment (e.g., ozone-water cleaning), or megasonic cleaning and ozone-water cleaning can be performed. Alternatively, ozone-water cleaning and cleaning with hydrofluoric acid can be repeated plural times. Such a surface treatment can remove dust such as organic matters on the surfaces of the insulating film 102 and the semiconductor substrate 111, thereby making the surfaces of the insulating film 102 and the semiconductor substrate 111 hydrophilic. The surface of the insulating film 102 can be made to be more hydrophilic because dangling bonds are formed in the surface of the insulating film 102 by the plasma treatment.

It is preferable that one or both of a thermal treatment and a pressure treatment be performed after bonding the single crystal semiconductor substrate 101 and the semiconductor substrate 111 to each other. The thermal treatment or the pressure treatment can improve the bonding strength between the single crystal semiconductor substrate 101 and the semiconductor substrate 111. The pressure treatment is performed so that pressure can be applied in a perpendicular direction to the bonding surface, with the resistance to pressure of the single crystal semiconductor substrate 101 and the semiconductor substrate 111 taken in mind.

Figure 1D:
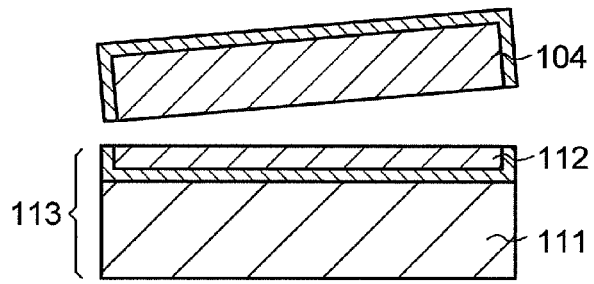

By performing the thermal treatment on the single crystal semiconductor substrate 101, the single crystal semiconductor substrate 101 is split along the embrittlement layer 103, whereby the single crystal semiconductor substrate 101 is separated into a single crystal semiconductor substrate 104 and the semiconductor substrate 111 to which a single crystal semiconductor layer 112 is bonded (see FIG. 1D). For this thermal treatment, a rapid thermal anneal (RTA) apparatus, a resistance heating furnace, or a microwave heating apparatus can be used. As the RTA apparatus, a gas rapid thermal anneal (GRTA) apparatus, which heats a substrate with a heated gas, or a heated gas and radiant heat, or a lamp rapid thermal anneal (LRTA) apparatus, which performs heating with a halogen lamp or an infrared ray lamp, can be used. In the thermal treatment, it is preferable to increase the temperature of the semiconductor substrate 111 to which the single crystal semiconductor layer 112 is bonded to a range of 550° C. to 650° C. inclusive.

In this embodiment mode, the thermal treatment is performed using a vertical furnace with a resistance heating unit. The semiconductor substrate 111 to which the single crystal semiconductor substrate 101 is bonded is placed on a boat of the vertical furnace. The boat is taken into a chamber of the vertical furnace. Then, the chamber is evacuated to produce a vacuum therein in order to suppress oxidation of the single crystal semiconductor substrate 101. The degree of vacuum is set to be about $5\times10^{-3}$ Pa. After producing a vacuum in the chamber, nitrogen is supplied into the chamber, so that the inside of the chamber is placed in a nitrogen atmosphere at atmospheric pressure. In this time, the temperature is increased to 200° C.

After placing the inside of the chamber in a nitrogen atmosphere at atmospheric pressure, heating is performed at 200° C. for 2 hours. After that, the temperature is increased to be 400° C. in 1 hour. After the state of a heating temperature of 400° C. is stabilized, the temperature is further increased to 600° C. in 1 hour. After the state of a heating temperature of 600° C. is stabilized, heating is performed at 600° C. for 2 hours. After that, the heating temperature is lowered to 400° C. in 1 hour, and 10 to 30 minutes later, the boat is taken out of the chamber. Then, in an air atmosphere, the single crystal semiconductor substrate 101 and the semiconductor substrate 111 to which the single crystal semiconductor substrate 101 is bonded, which are on the boat, are cooled down.

In the thermal treatment in which the resistance heating furnace is used, a thermal treatment for increasing the bonding strength between the single crystal semiconductor substrate 101 and the semiconductor substrate 111 and a thermal treatment for splitting the single crystal semiconductor substrate 101 along the embrittlement layer 103 are performed successively. In a case where the two thermal treatments are performed with different apparatuses, for example, in a resistance heating furnace or a clean oven, a heating treatment is performed at 200° C. for 2 hours, and then the semiconductor substrate 111 and the single crystal semiconductor substrate 101, which are bonded to each other, are taken out of the furnace; subsequently, in an RTA apparatus, a heating treatment is performed at 600° C. to 700° C. inclusive for 1 to 30 minutes inclusive, so that the single crystal semiconductor substrate 101 is split along the embrittlement layer 103.

Through the above process, an SOI substrate 113 can be obtained (see FIG. 1D). The SOI substrate 113 illustrated in FIG. 1D has the insulating film 102 including halogen over the semiconductor substrate 111, and the single crystal semiconductor layer 112 over the insulating film 102 including halogen.

A planarization treatment may be performed on a surface of the SOI substrate obtained through the above process. A planarization treatment can planarize the surface of the SOI substrate even if the single crystal semiconductor layer 112 provided over the semiconductor substrate 111 has a rough surface after the separation.

The planarization treatment can be performed by chemical mechanical polishing (CMP), an etching treatment, laser light irradiation, or the like. In this example, an etching treatment (an etch back treatment) is performed in which one or both of dry etching and wet etching are performed, and then laser light irradiation is performed, whereby the single crystal semiconductor layer 112 is recrystallized and the surface thereof is planarized.

By irradiating the single crystal semiconductor layer 112 with laser light from an upper face side, the upper face of the single crystal semiconductor layer 112 can be melted. It is preferable to perform the laser light irradiation in an atmosphere under a reduced pressure which contains an inert gas such as $N_2$ or Ar, and includes oxygen at a concentration of less than or equal to 1%. After melting the upper face of the single crystal semiconductor layer 112, the single crystal semiconductor layer 112 is cooled down and is solidified, so that the single crystal semiconductor layer 112 can have a top face with improved planarity. With the use of laser light, the semiconductor substrate 111 is not directly heated; therefore, an increase in the temperature of the semiconductor substrate 111 can be suppressed.

It is preferable that the single crystal semiconductor layer 112 be partially melted with the laser light irradiation because complete melting of the single crystal semiconductor layer 112 is most probably accompanied by microcrystallization due to disordered nucleation in a liquid phase to lower the crystallinity. On the other hand, partial melting allows crystals to grow from a portion in a solid phase which is not melted. Thus, defects in the semiconductor layer can be reduced. "Complete melting" here means that the single crystal semiconductor layer 112 is melted to the lower interface or a vicinity thereof to become a liquid. On the other hand, "partial melting" in this case means that an upper portion of the single crystal semiconductor layer 112 is melted to be a liquid while a lower portion is not melted and remains in a solid phase.

It is preferable to use a pulsed laser for the laser light irradiation because a pulsed laser can instantaneously emit pulsed laser light with high energy and can produce a melted state. It is preferable that the repetition rate be about 1 Hz to 10 MHz inclusive.

After the laser light irradiation is performed as described above, the single crystal semiconductor layer 112 may undergo a film thinning step to have a smaller thickness. The single crystal semiconductor layer 112 may be thinned by an etching treatment (an etch back treatment) in which one or both of dry etching and wet etching are performed. For example, if the single crystal semiconductor layer 112 is formed of a silicon material, the single crystal semiconductor layer 112 can be thinned by dry etching using $SF_6$ and $O_2$, or $Cl_2$ as a process gas.

The insulating film including halogen (e.g., chlorine) on the surface of the single crystal semiconductor substrate can prevent an impurity such as a movable ion or water that is included in the semiconductor substrate from diffusing into the single crystal semiconductor layer 112.

Although this embodiment mode presents a method in which the thermal oxidation treatment is performed in an oxidation atmosphere to which halogen is added, this embodiment mode is not limited to this; halogen may be added by an ion implantation method or an ion doping method after forming the insulating film 102 by dry oxidation.

By cutting a Si—O bond, the structure is loosened and water is absorbed, so that the speed of diffusion is increased. Through the process of the thermal treatment at a low temperature after the bonding at a low temperature, a dehydration condensation reaction occurs (when a water molecule is released) and an excess water molecule is absorbed in the silicon oxide film, thereby promoting a dehydration reaction (at the bonding surface). Thus, a bonding strength improves even with a low-temperature treatment.

Although this embodiment mode presents a method in which the insulating film 102 formed on the single crystal semiconductor substrate 101 undergoes a plasma treatment by applying a bias voltage thereto, this embodiment mode is not limited to this; the surface of the semiconductor substrate 111 can also undergo a plasma treatment by applying a bias voltage thereto. Further, it is also possible to have each of the surfaces of the semiconductor substrate 111 and the insulating film 102 formed on the single crystal semiconductor substrate 101 undergo a plasma treatment by applying a bias voltage thereto.

The planarization treatment is not limited to being performed on the SOI substrate, and may be performed on the single crystal semiconductor substrate 104, which has undergone separation. Planarizing a surface of the single crystal semiconductor substrate 104, which has undergone separation, makes it possible to reuse the single crystal semiconductor substrate 104 in a process of manufacturing an SOI substrate.

Embodiment Mode 2

This embodiment mode describes a method for manufacturing an SOI substrate which is different from that of the preceding embodiment mode with reference to the drawings. Specifically, a method is described in which after forming a Si-based insulating film on a semiconductor substrate side and treating the insulating film with oxygen plasma, the semiconductor substrate and a single crystal semiconductor substrate in which an embrittlement layer is formed are bonded to each other. Hereinafter, the same reference numerals are given to parts with similar structures to those of Embodiment Mode 1, and description thereof is omitted.

First, a single crystal semiconductor substrate 101 is prepared, and is cleaned with a sulfuric acid/hydrogen peroxide mixture (SPM), an ammonia/hydrogen peroxide mixture (APM), a hydrochloric acid/hydrogen peroxide mixture (HPM), dilute hydrofluoric acid (DHF), ozone water, or the like as appropriate (see FIG. 2A-1).

Next, a protective layer (not illustrated) is formed over one surface of the single crystal semiconductor substrate 101. Then, the single crystal semiconductor substrate 101 is irradiated with ions from the surface side over which the protective layer is formed, to introduce the ions into the single crystal semiconductor substrate, so that an embrittlement layer 103 is formed in a region at a predetermined depth of the one surface of the single crystal semiconductor substrate 101 (see FIG. 2A-2). The embrittlement layer 103 can be formed in a similar manner to that illustrated in FIG. 1A-3.

The protective layer, which is used to prevent the surface of the single crystal semiconductor substrate 101 from being etched or being damaged in forming the embrittlement layer 103, is formed using a silicon oxide film, a silicon nitride film, a silicon oxynitride film, a silicon nitride oxide film, or the like. As the protective layer, for example, chemical oxide with a thickness of 2 nm to 5 nm is formed on the surface of the single crystal semiconductor substrate 101, with ozone water, hydrogen peroxide water, or an ozone atmosphere. Alternatively, as the protective layer, an oxide film with a thickness of 2 nm to 10 nm may be formed on the surface of the single crystal semiconductor substrate 101 by a thermal oxidation method or an oxygen radical treatment. Further alternatively, a protective layer with a thickness of 2 nm 10 nm may be formed by a plasma CVD method.

In this specification, note that a silicon oxynitride film means a film that includes more oxygen than nitrogen and, in a case where measurements are performed using Rutherford backscattering spectrometry (RBS) and hydrogen forward scattering (HFS), includes oxygen, nitrogen, silicon, and hydrogen at concentrations ranging from 50 to 70 atomic %, 0.5 to 15 atomic %, 25 to 35 atomic %, and 0.1 to 10 atomic %, respectively. In this specification, further, a silicon nitride oxide film means a film that includes more nitrogen than oxygen and, in a case where measurements are performed using RBS and IFS, includes oxygen, nitrogen, silicon, and hydrogen at concentrations ranging from 5 to 30 atomic %, 20 to 55 atomic %, 25 to 35 atomic %, and 10 to 30 atomic %, respectively. Note that percentages of nitrogen, oxygen, silicon, and hydrogen fall within the ranges given above, where the total number of atoms contained in silicon oxynitride or silicon nitride oxide is defined as 100 atomic %.

The depth at which the embrittlement layer 103 is formed can be controlled with the ion species, or the kinetic energy or incidence angle of the ions. The kinetic energy can be controlled with the acceleration voltage or the like. The embrittlement layer 103 is formed in a region at a depth equal to or almost equal to the average penetration depth of the ions. The thickness of a single crystal semiconductor layer that is separated from the single crystal semiconductor substrate 101 in a later step is determined with the depth to which the ions are introduced. The embrittlement layer 103 is formed at a depth of 10 nm to 500 nm inclusive, preferably 50 nm to 200 nm inclusive.

In introducing the ions into the single crystal semiconductor substrate 101, an ion doping apparatus can be used. When an ion doping apparatus is used, a source gas is excited to produce plasma, and ions extracted from the plasma are introduced into an object without mass separation of the ions. With the use of an ion doping apparatus, the single crystal semiconductor substrate 101 can be doped uniformly. When an ion doping apparatus provided with a mass separation unit is used, ion implantation, which is accompanied by mass separation, can be performed.

When an ion doping method is used, a hydrogen gas, a rare gas, or the like can be given as a source gas used in adding the ions; in this embodiment mode, it is preferable to use a hydrogen gas. When a hydrogen gas is used as the source gas, ions generated are $H^+$, $H_2^+$, and $H_3^+$; it is preferable that $H_3^+$ be introduced at the highest percentage. Introduction efficiency of hydrogen atoms in utilizing $H_3^+$ is superior to that in utilizing $H^+$ or $H_2^+$, and introduction time can be shortened.

Next, a semiconductor substrate 111 is prepared, and is cleaned with a sulfuric acid/hydrogen peroxide mixture (SPM), an ammonia/hydrogen peroxide mixture (APM), a hydrochloric acid/hydrogen peroxide mixture (HPM), dilute hydrofluoric acid (DHF), ozone water, or the like as appropriate (see FIG. 2B-1).

Subsequently, the semiconductor substrate 111 undergoes a thermal oxidation treatment to form an insulating film 114 (see FIG. 2B-2). Although dry oxidation may be performed as the thermal oxidation treatment, it is preferable to perform oxidation in which halogen is added to an oxidation atmosphere. By performing oxidation in which halogen is added to an oxidation atmosphere, halogen can be included in the insulating film 114. As a gas for adding halogen to an oxidation atmosphere, HCl can be used. As an example of such a thermal oxidation treatment, it is preferable to perform thermal oxidation at 900° C. to 1150° C. (typically 1000° C.) in an atmosphere including HCl at 0.5 to 10 volume % (more preferably 3 volume %) with respect to oxygen. It is preferable that the treatment time be 0.1 to 6 hours, more preferably 0.5 to 1 hour. The insulating film 114 is formed with a thickness of 10 nm to 1000 nm (preferably 50 nm to 300 nm), e.g., 200 nm.

A thermal treatment at temperatures in the above range can provide a gettering effect due to halogen (e.g., chlorine) for the semiconductor substrate 111. As the gettering effect, an effect of removing a metal impurity can be produced. That is, with action of halogen, an impurity such as a metal turns into volatile halide and is released into air to be removed from the semiconductor substrate 111. It is effective on the semiconductor substrate 111 which has undergone chemical mechanical polishing (CMP).

As the gas for adding halogen to the oxidation atmosphere which is applied to the thermal oxidation treatment, one or more of HF, $NF_3$, HBr, $Cl_2$, t-DCE (trans-1,2-dichloroethylene), $ClF_3$, $BCl_3$, $F_2$, $Br_2$, and the like can be used instead of HCl. Instead of trans-1,2-dichloroethylene, cis-1,2-dichloroethylene, 1,1-dichloroethylene, or a mixed gas of two or more kinds of the above may also be used.

Further, halogen is included in the insulating film 114 which is formed by undergoing thermal oxidation with halogen added; when halogen is included in the insulating film 114 at a concentration of $1 \times 10^{16}$ atoms/cm$^3$ to $2 \times 10^{21}$ atoms/cm$^3$ inclusive, the insulating film 114 can function as a protective film for trapping impurities such as a metal and preventing the semiconductor substrate 111 from being contaminated.

Further, in the halogen included in the insulating film 114, fluorine can also be included in addition to chlorine. In such a case, it is preferable that fluorine be included in a smaller amount than chlorine.

Next, the insulating film 114 undergoes a plasma treatment by applying a bias voltage thereto (see FIG. 2B-3).

The plasma treatment is performed in plasma which is produced by introducing an inert gas (e.g., an argon (Ar) gas) and/or a reactive gas (e.g., an oxygen ($O_2$) gas or a nitrogen ($N_2$) gas) into a chamber in a vacuum and applying a bias voltage to a face to be treated.

For example, when the plasma treatment is performed using an oxygen gas, an $O_2$ gas is introduced into a chamber in a vacuum and a bias voltage is applied to a face to be treated (in this example, the insulating film 114 formed on the semiconductor substrate 111) to produce plasma. There are oxygen cations in plasma, and the oxygen cations are accelerated in a direction of a cathode (the insulating film 114 formed on the semiconductor substrate 111). The accelerated oxygen cations collide with a surface of the insulating film 114, thereby cutting Si—O bonds in a surface layer of the insulating film 114 to reduce the density of the surface of the insulating film 114; thus, the surface of the insulating film 114 is damaged and dangling bonds are generated therein, so that the surface can be activated.

Specifically, oxygen plasma may be produced under the following condition: the electric power for the treatment is 0.3 W/cm$^2$ to 1.5 W/cm$^2$; the pressure is 30 Pa to 130 Pa; and the gas ($O_2$) flow rate is 10 sccm to 200 sccm.

Further, the oxygen plasma treatment makes the insulating film 114 have a surface roughness (Ra) of less than or equal to 0.5 nm, preferably less than or equal to 0.3 nm, more preferably less than or equal to 0.2 nm; and a maximum height difference (P-V) of less than or equal to 6 nm, more preferably less than or equal to 3 nm.

After that, the insulating film 114 including halogen and the surface of the single crystal semiconductor substrate 101 which has undergone the ion irradiation are bonded so as to face each other (see FIG. 2C). Subsequently, a thermal treatment is performed to split the single crystal semiconductor substrate 101 along the embrittlement layer 103, so that the single crystal semiconductor substrate 101 is separated into a single crystal semiconductor substrate 104 and the semiconductor substrate 111 to which a single crystal semiconductor layer 112 is bonded. Thus, an SOI substrate 113 can be formed in which the single crystal semiconductor layer 112 is formed over the semiconductor substrate 111 with the insulating film 114 interposed therebetween (see FIG. 2D).

It is preferable that the single crystal semiconductor substrate 101 and the insulating film 114 formed on the semiconductor substrate 111 each undergo a surface treatment before bonding the single crystal semiconductor substrate 101 and the semiconductor substrate 111 to each other. As the surface treatment, an ozone treatment (e.g., ozone-water cleaning), megasonic cleaning and ozone-water cleaning, megasonic cleaning and ammonia/hydrogen peroxide mixture (APM) cleaning, or APM cleaning and two-fluid cleaning in which pure water and nitrogen are used can be performed. Such a surface treatment can remove dust such as organic matters on the surfaces of the single crystal semiconductor substrate 101 and the insulating film 114, thereby making the surfaces of the single crystal semiconductor substrate 101 and the insulating film 114 hydrophilic.

Since the steps illustrated in FIGS. 2C and 2D can be performed in a similar manner to those illustrated in FIGS. 1C and 1D, detailed description thereof is omitted.

A planarization treatment may be performed on a surface of the SOI substrate obtained through the above process. The planarization treatment can be performed by the method presented in Embodiment Mode 1.

Although this embodiment mode presents a method in which the thermal oxidation treatment is performed in an oxidation atmosphere to which halogen is added, this embodiment mode is not limited to this; halogen may be added by an ion implantation method or an ion doping method after forming the insulating film 114 by dry oxidation.

Although this embodiment mode presents a method in which the insulating film 114 formed on the semiconductor substrate 111 undergoes a plasma treatment by applying a bias voltage thereto, this embodiment mode is not limited to this; the surface of the single crystal semiconductor substrate 101 in which the embrittlement layer 103 is formed can also undergo a plasma treatment by applying a bias voltage thereto. Further, it is also possible to have each of the surfaces of the single crystal semiconductor substrate 101 and the insulating film 114 formed on the semiconductor substrate 111 undergo a plasma treatment by applying a bias voltage thereto.

Embodiment Mode 3

This embodiment mode describes a method for manufacturing an SOI substrate which is different from those presented in the preceding embodiment modes with reference to the drawings. Specifically, a method is described in which after forming an insulating film on each of a single crystal semiconductor substrate and a semiconductor substrate and treating the insulating film formed on the single crystal semiconductor substrate with plasma, the semiconductor substrate and the single crystal semiconductor substrate are bonded to each other. Hereinafter, the same reference numerals are given to parts with similar structures to those of Embodiment Modes 1 and 2, and description thereof is omitted.

First, a single crystal semiconductor substrate 101 is prepared in which an insulating film 102 has been formed on a surface; an embrittlement layer 103 has been formed in a region at a predetermined depth from a surface; and the insulating film 102 has undergone a plasma treatment by applying a bias voltage thereto (see FIGS. 3A-1 to 3A-4). With regard to FIGS. 3A-1 to 3A-4, detailed description thereof is omitted because the method illustrated in FIGS. 1A-1 to 1A-4 may be used.

Subsequently, a semiconductor substrate 111 is prepared, and is cleaned with a sulfuric acid/hydrogen peroxide mixture (SPM), an ammonia/hydrogen peroxide mixture (APM), a hydrochloric acid/hydrogen peroxide mixture (HPM), dilute hydrofluoric acid (DHF), ozone water, or the like as appropriate (see FIG. 3B-1).

Then, the semiconductor substrate 111 undergoes a thermal oxidation treatment to form an insulating film 114 (see FIG. 3B-2). As the thermal oxidation treatment, dry oxidation or oxidation in which halogen is added to an oxidation atmosphere may be performed. The insulating film 114 is formed with a thickness of 10 nm to 1000 nm (preferably 50 nm to 300 nm), e.g., 200 nm.

After that, the insulating film 102 including halogen (on the side in which the embrittlement layer is formed) and a face of the insulating film 114 are bonded so as to face each other (see FIG. 3C). Subsequently, a thermal treatment is performed to split the single crystal semiconductor substrate 101 along the embrittlement layer 103, so that an SOI substrate 113 can be formed in which a single crystal semiconductor layer 112 is formed over the semiconductor substrate 111 with the insulating films 114 and 102 interposed therebetween (see FIG. 3D).

Since the steps illustrated in FIGS. 3C and 3D can be performed in a similar manner to those illustrated in FIGS. 1C and 1D, detailed description thereof is omitted.

A planarization treatment may be performed on a surface of the SOI substrate obtained through the above process. The planarization treatment can be performed by the method presented in Embodiment Mode 1.

Although this embodiment mode presents a method in which the thermal oxidation treatment is performed in an oxidation atmosphere to which halogen is added, this embodiment mode is not limited to this; halogen may be added by an ion implantation method or an ion doping method after forming the insulating film 102 by dry oxidation. Further, although this embodiment mode presents a method in which halogen is added to the insulating film 102, this embodiment mode is not limited to this; alternatively, halogen may be added to the insulating film 114. Further alternatively, in forming an insulating film on each of the single crystal semiconductor substrate and the semiconductor substrate, an insulating film to which halogen is added may be formed on both of the faces that form a bond.

Although this embodiment mode presents a method in which the insulating film 102 formed on the single crystal semiconductor substrate 101 undergoes a plasma treatment by applying a bias voltage thereto, this embodiment mode is not limited to this; the surface of the insulating film 114 formed on the semiconductor substrate 111 can also undergo a plasma treatment by applying a bias voltage thereto. Further, it is also possible to have each of the surfaces of the insulating film 102 formed on the single crystal semiconductor substrate 101 and the insulating film 114 formed on the semiconductor substrate 111 undergo a plasma treatment by applying a bias voltage thereto.

Embodiment Mode 4

This embodiment mode describes a method for manufacturing an SOI substrate which is different from those presented in the preceding embodiment modes with reference to the drawings. Hereinafter, the same reference numerals are given to parts with similar structures to those of Embodiment Modes 1 to 3, and description thereof is omitted.

Figures 1, 4A:
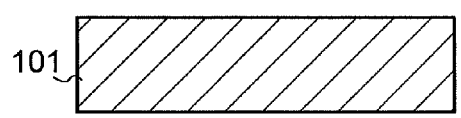
Figures 2, 4A:
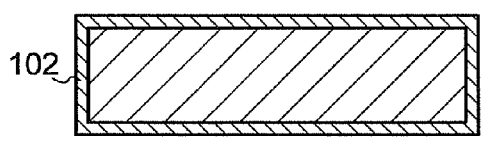
Figures 3, 4A:
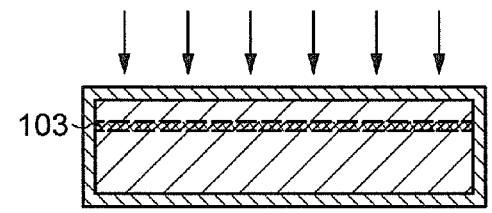
Figures 4, 4A:
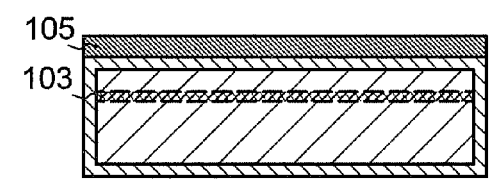

First, a single crystal semiconductor substrate 101 is prepared in which an insulating film 102 has been formed on a surface and an embrittlement layer 103 has been formed in a region at a predetermined depth from a surface (see FIGS. 4A-1 to 4A-3). With regard to FIGS. 4A-1 to 4A-3, detailed description thereof is omitted because the method illustrated in FIGS. 1A-1 to 1A-3 may be used.

Subsequently, an insulating film 105 is further formed on the insulating film 102 (see FIG. 4A-4). The insulating film 105 can be formed by a chemical vapor deposition (CVD) method, with a single-layer structure or a stacked-layer structure including two or more layers selected from a silicon oxide film, a silicon oxynitride film, a silicon nitride oxide film, and a silicon nitride film. It is preferable that the insulating film 105 have a thickness in a range of 10 nm to 1000 nm. The chemical vapor deposition method in this specification includes a plasma CVD method, a thermal CVD method, and a photo-CVD method in its category.

Figures 4, 4A, 5:
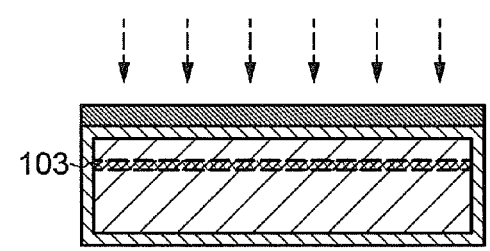

Next, the insulating film 105 undergoes a plasma treatment by applying a bias voltage thereto (see FIG. 4A-5). The plasma treatment can be performed in a similar manner to that illustrated in FIG. 1A-4.

Subsequently, a semiconductor substrate 111 is prepared, and is cleaned with a sulfuric acid/hydrogen peroxide mixture (SPM), an ammonia/hydrogen peroxide mixture (APM), a hydrochloric acid/hydrogen peroxide mixture (HPM), dilute hydrofluoric acid (DHF), or the like as appropriate (see FIG. 4B-1).

Figures 1, 4B:
Figures 2, 4B:
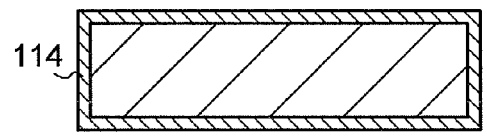

Then, the semiconductor substrate 111 undergoes a thermal oxidation treatment to form an insulating film 114 (see FIG. 4B-2). As the thermal oxidation treatment, dry oxidation or oxidation in which halogen is added to an oxidation atmosphere may be performed. The insulating film 114 is formed with a thickness of 10 nm to 1000 nm (preferably 50 nm to 300 nm), e.g., 200 nm.

Figure 4C:
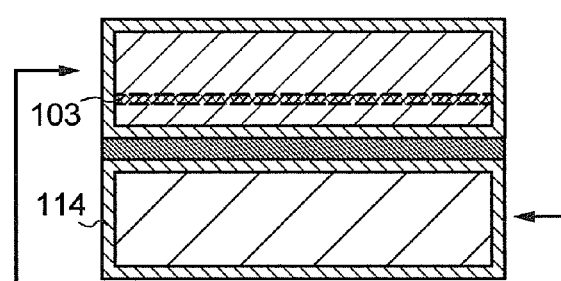

After that, the insulating film 105 and a face of the insulating film 114 are bonded so as to face each other (see FIG. 4C). Subsequently, a thermal treatment is performed to split the single crystal semiconductor substrate 101 along the embrittlement layer 103, so that an SOI substrate 113 can be formed in which a single crystal semiconductor layer 112 is formed over the semiconductor substrate 111 with the insulating films 114, 105, and 102 interposed therebetween (see FIG. 4D).

Figure 4D:
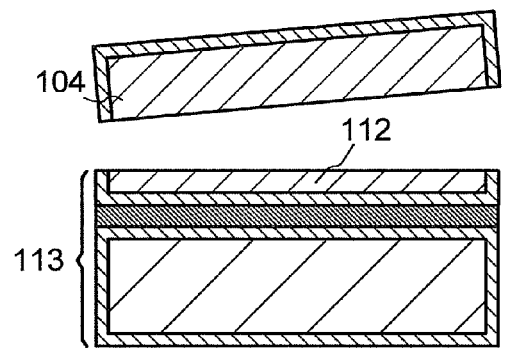

Since the steps illustrated in FIGS. 4C and 4D can be performed in a similar manner to those illustrated in FIGS. 1C and 1D, detailed description thereof is omitted.

In this embodiment mode, a planarization treatment may be performed on a surface of the SOI substrate obtained. The planarization treatment can be performed by the method presented in Embodiment Mode 1.

Although this embodiment mode presents a method in which the insulating film formed by a CVD method is provided on the single crystal semiconductor substrate 101 side, this embodiment mode is not limited to this; alternatively, the insulating film formed by a CVD method may be provided on the semiconductor substrate 111 side. Further alternatively, in forming an insulating film on an insulating film formed by thermal oxidation, the insulating film formed by a CVD method can be provided for both the single crystal semiconductor substrate 101 and the semiconductor substrate 111 side.

Although this embodiment mode presents a method in which the insulating film formed over the single crystal semiconductor substrate 101 undergoes a plasma treatment by applying a bias voltage thereto, this embodiment mode is not limited to this; a surface of the insulating film provided for the semiconductor substrate 111 can also undergo a plasma treatment by applying a bias voltage thereto. Further, it is also possible to have each of the surfaces of the insulating film formed over the single crystal semiconductor substrate 101 and the insulating film formed on the semiconductor substrate 111 undergo a plasma treatment by applying a bias voltage thereto.

Although Embodiment Modes 1 to 4 describe methods in which an ion doping apparatus is used to introduce the ions into the single crystal semiconductor substrate 101, a method for manufacturing an SOI substrate is not limited to this; alternatively, an ion implantation apparatus may be used instead of the ion doping apparatus to perform an ion implantation method. When an ion implantation apparatus is used, a source gas is excited to produce plasma, and ions are extracted from the plasma and undergo mass separation, and the ions with predetermined mass are implanted into an object. In a case where an ion implantation apparatus is used, it is preferable to have $H_3^+$ ions implanted with mass separation. Needless to say, alternatively, $H_2^+$ ions may be implanted; however, note that when an ion implantation apparatus, with which ions are implanted selectively, is used, ion implantation efficiency can be lower than a case of using an ion doping apparatus.

Embodiment Mode 5

This embodiment mode describes a method for forming a complementary metal oxide semiconductor (CMOS) as an example of a method for manufacturing a semiconductor device which is intended to manufacture a semiconductor device having a semiconductor element with high performance and high reliability in a high yield, with reference to FIGS. 5A to 5E and FIGS. 6A to 6D. Repeated description of the same parts as or parts having similar functions to those in Embodiment Mode 1 is omitted.

Figure 5A:
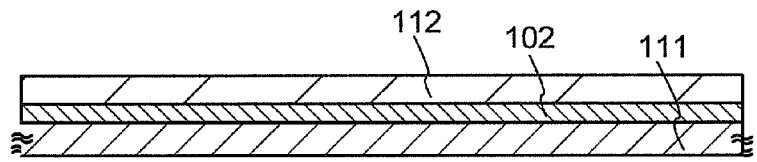
FIGS. 5A to 5E are drawings illustrating an example of a method for manufacturing a semiconductor device in which an SOI substrate is used.

In FIG. 5A, an insulating film 102 and a single crystal semiconductor layer 112 are formed over a semiconductor substrate 111. Although an example is presented here in which the SOI substrate 113 with the structure illustrated in FIG. 1D is used, an SOI substrate with another structure illustrated in this specification can also be employed.

The single crystal semiconductor layer 112 has been separated from a single crystal semiconductor substrate 101, and has undergone a planarization treatment. The planarization treatment can be performed by chemical mechanical polishing (CMP), an etching treatment, laser light irradiation, or the like. In this example, an etching treatment (an etch back treatment) is performed in which one or both of dry etching and wet etching are performed, and then laser light irradiation is performed, whereby the single crystal semiconductor layer 112 is recrystallized and a surface thereof is planarized; therefore, crystal defects are reduced and the planarity is high in the single crystal semiconductor layer 112.

Before etching the single crystal semiconductor layer 112, it is preferable that an impurity element such as boron, aluminum, gallium, phosphorus, or arsenic be added to the single crystal semiconductor layer 112 in order to control the threshold voltage of a TFT. For example, an impurity element is added into a formation region of an n-channel TFT, and an impurity element is added into a formation region of a p-channel TFT.

Figure 5B:
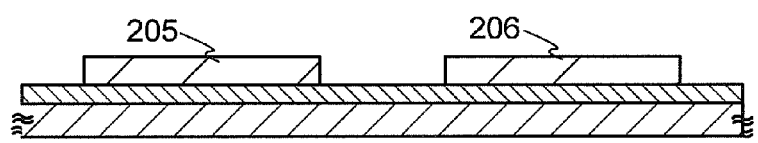

Next, the single crystal semiconductor layer 112 is etched to form single crystal semiconductor layers 205 and 206, which are separated in island shapes in accordance with the position of semiconductor elements (see FIG. 5B).

Oxide films on the single crystal semiconductor layers are removed, and a gate insulating layer 207 is formed to cover the single crystal semiconductor layers 205 and 206. Even if the gate insulating layer formed over the single crystal semiconductor layers 205 and 206 is thin, the gate insulating layer 207 can cover the single crystal semiconductor layers 205 and 206 with excellent coverage because the single crystal semiconductor layers 205 and 206 in this embodiment mode have high planarity. Thus, a characteristic defect due to defective coverage with the gate insulating layer can be prevented, so that semiconductor devices with high reliability can be manufactured in a high yield. It is effective to thin the gate insulating layer 207 in operating a thin film transistor at high speed at a low voltage.

The gate insulating layer 207 may be formed using silicon oxide or a stacked-layer structure of silicon oxide and silicon nitride. The gate insulating layer 207 may be formed by depositing an insulating film by a plasma CVD method or a reduced-pressure CVD method; it is preferably formed by solid phase oxidation or solid phase nitridation by a plasma treatment because a gate insulating layer formed by oxidizing or nitriding a single crystal semiconductor layer by a plasma treatment has a high density, high dielectric strength, and high reliability.

As the gate insulating layer 207, alternatively, a material with a high dielectric constant, such as zirconium dioxide, hafnium oxide, titanium dioxide, or tantalum pentoxide, may be used. By using a material with a high dielectric constant for the gate insulating layer 207, a gate leakage current can be reduced.

Figure 5C:
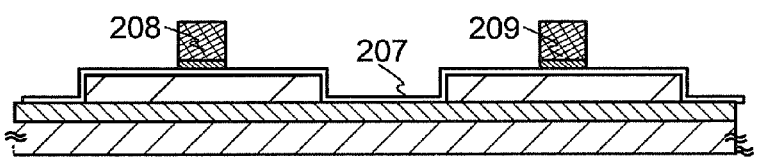
Figure 5D:
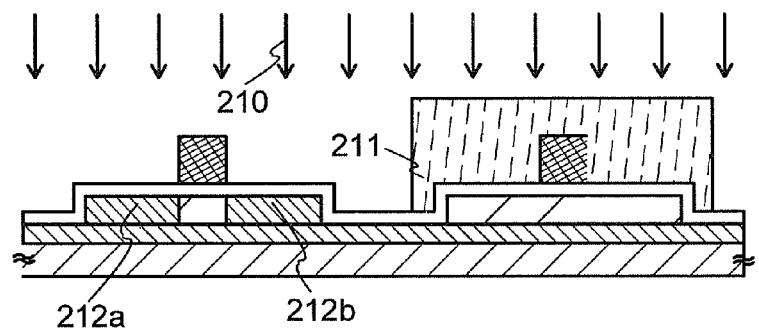
Figure 5E:
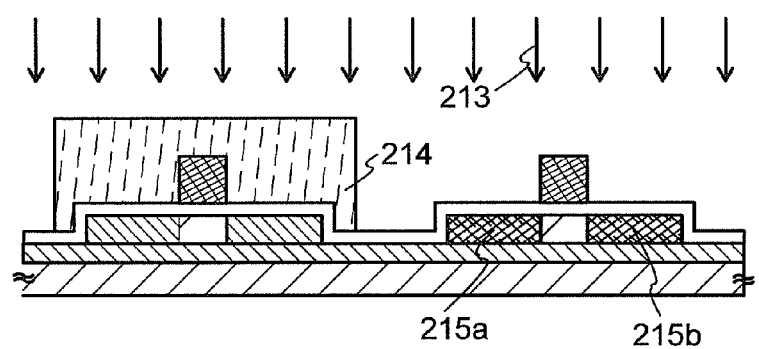

A gate electrode layer 208 and a gate electrode layer 209 are formed over the gate insulating layer 207 (see FIG. 5C). The gate electrode layers 208 and 209 can be formed by a sputtering method, a vapor deposition method, a CVD method, or the like. The gate electrode layers 208 and 209 may be formed using an element selected from tantalum (Ta), tungsten (W), titanium (Ti), molybdenum (Mo), aluminum (Al), copper (Cu), chromium (Cr), and neodymium (Nd); or an alloy material or a compound material that mainly contains any of these elements. Alternatively, as the gate electrode layers 208 and 209, a semiconductor layer typified by a polycrystalline silicon layer doped with an impurity element such as phosphorus, or an AgPdCu alloy may be used.

A mask 211 is formed to cover the single crystal semiconductor layer 206. With the mask 211 and the gate electrode layer 208 used as masks, an impurity element 210 imparting n-type conductivity is added to form first n-type impurity regions 212a and 212b (see FIG. 5D). In this embodiment mode, phosphine ($PH_3$) is used as a doping gas including the impurity element. In this example, the doping is performed so that the first n-type impurity regions 212a and 212b can include the impurity element imparting n-type conductivity at a concentration of about $1 \times 10^{17}/cm^3$ to $5 \times 10^{18}/cm^3$. In this embodiment mode, phosphorus (P) is used as the impurity element imparting n-type conductivity.

Next, a mask 214 is formed to cover the single crystal semiconductor layer 205. With the mask 214 and the gate electrode layer 209 used as masks, an impurity element 213 imparting p-type conductivity is added to form first p-type impurity regions 215a and 215b (see FIG. 5E). In this embodiment mode, diborane ($B_2H_6$) or the like is used as a doping gas including the impurity element because boron (B) is used as the impurity element.

The mask 214 is removed. Then, sidewall insulating layers 216a to 216d with a sidewall structure are formed on side faces of the gate electrode layers 208 and 209, and gate insulating layers 233a and 233b are formed (see FIG. 6A). With regard to the sidewall insulating layers 216a to 216d, an insulating layer is formed to cover the gate electrode layers 208 and 209, and then is processed by anisotropic etching by a reactive ion etching (RIE) method, so that the sidewall insulating layers 216a to 216d with a sidewall structure may be formed on the side faces of the gate electrode layers 208 and 209 in a self-aligned manner. There is no particular limitation on the insulating layers; it is preferable that the insulating layers be silicon oxide with favorable step coverage which is formed with a reaction of tetraethyl orthosilicate (TEOS), silane, or the like with oxygen, nitrous oxide, or the like. The insulating layers can be formed by a thermal CVD method, a plasma CVD method, a normal-pressure CVD method, a bias ECRCVD method, a sputtering method, or the like. The gate insulating layers 233a and 233b can be formed by etching the gate insulating layer 207 with the gate electrode layers 208 and 209 and the sidewall insulating layers 216a to 216d used as masks.

In this embodiment mode, in etching the insulating layer, although portions of the insulating layer over the gate electrode layers are removed to expose the gate electrode layers; however, the sidewall insulating layers 216a to 216d may be formed to leave the portions of the insulating layer over the gate electrode layers. Further, a protective film may be formed over the gate electrode layers in a later step. By protecting the gate electrode layers in such a manner, reduction in the thickness of the gate electrode layers can be prevented in the etching process. In addition, if silicide is formed in a source region and a drain region, a metal film deposited in forming the silicide is not in contact with the gate electrode layers; thus, defects such as a chemical reaction and diffusion can be prevented even if a material of the metal film is prone to reacting with a material of the gate electrode layers. The etching method may be either a dry etching method or a wet etching method, and various etching methods can be employed. In this embodiment mode, a dry etching method is used. As an etching gas, a chlorine-based gas typified by $Cl_2$, $BCl_3$, $SiCl_4$, or $CCl_4$, a fluorine-based gas typified by $CF_4$, $SF_6$, or $NF_3$, or $O_2$ can be used as appropriate.

Subsequently, a mask 218 is formed to cover the single crystal semiconductor layer 206. With the mask 218, the gate electrode layer 208, and the sidewall insulating layers 216a and 216b used as masks, an impurity element 217 imparting n-type conductivity is added to form second n-type impurity regions 219a and 219b and third n-type impurity regions 220a and 220b. In this embodiment mode, $PH_3$ is used as a doping gas including the impurity element. Here, the doping is performed so that the second n-type impurity regions 219a and 219b can include the impurity element imparting n-type conductivity at a concentration of about $5\times10^{19}/cm^3$ to $5\times10^{20}/cm^3$. In addition, a channel formation region 221 is formed in the single crystal semiconductor layer 205 (see FIG. 6B).

The second n-type impurity regions 219a and 219b are high-concentration n-type impurity regions and function as a source and a drain. On the other hand, the third n-type impurity regions 220a and 220b are low-concentration impurity regions and function as lightly-doped drain (LDD) regions. The third n-type impurity regions 220a and 220b have an effect of reducing an off current because they are formed in Loff regions, which are not covered with the gate electrode layer 208. Consequently, a semiconductor device with higher reliability and lower power consumption can be manufactured.

The mask 218 is removed, and a mask 223 is formed to cover the single crystal semiconductor layer 205. With the mask 223, the gate electrode layer 209, and the sidewall insulating layers 216c and 216d used as masks, an impurity element 222 imparting p-type conductivity is added to form second p-type impurity regions 224a and 224b and third p-type impurity regions 225a and 225b.

The doping is performed so that the second p-type impurity regions 224a and 224b can include the impurity element imparting p-type conductivity at a concentration of about $1\times10^{20}/cm^3$ to $5\times10^{21}/cm^3$. In this embodiment mode, the third p-type impurity regions 225a and 225b are formed in a self-aligned manner with the sidewall insulating layers 216c and 216d so as to have a lower concentration than the second p-type impurity regions 224a and 224b. In addition, a channel formation region 226 is formed in the single crystal semiconductor layer 206 (see FIG. 6C).

The second p-type impurity regions 224a and 224b are high-concentration p-type impurity regions and function as a source and a drain. On the other hand, the third p-type impurity regions 225a and 225b are low-concentration impurity regions and function as lightly-doped drain (LDD) regions. The third p-type impurity regions 225a and 225b have an effect of reducing an off current because they are formed in Loff regions, which are not covered with the gate electrode layer 209. Consequently, a semiconductor device with higher reliability and lower power consumption can be manufactured.

The mask 223 is removed. Then, in order to activate the impurity element, a thermal treatment, strong light irradiation, or laser beam irradiation may be performed, which can repair plasma damage to the gate insulating layers and to the interface between the gate insulating layer and the single crystal semiconductor layer as well as activating the impurity element.

Subsequently, an interlayer insulating layer is formed to cover the gate electrode layers and the gate insulating layers. In this embodiment mode, a stacked-layer structure of an insulating film 227 including hydrogen, which functions as a protective film, and an insulating layer 228 is formed. The insulating film 227 and the insulating layer 228 may be formed using a silicon nitride film, a silicon nitride oxide film, a silicon oxynitride film, or a silicon oxide film by a sputtering method or a plasma CVD method. Alternatively, a single-layer structure or a stacked-layer structure of three or more layers of other insulating films including silicon may also be employed.

Furthermore, a step is performed in which a thermal treatment is performed in a nitrogen atmosphere at 300° C. to 550° C. for 1 to 12 hours to hydrogenate the single crystal semiconductor layers. It is preferable to perform the thermal treatment at 400° C. to 500° C. Through this step, dangling bonds in the single crystal semiconductor layers are terminated with hydrogen included in the insulating film 227, which is the interlayer insulating film. In this embodiment mode, the thermal treatment is performed at 410° C. for 1 hour.

As another example, the insulating film 227 and the insulating layer 228 can be formed using aluminum nitride (AlN), aluminum oxynitride (AlON), aluminum nitride oxide (AlNO), which includes more nitrogen than oxygen, aluminum oxide, diamond-like carbon (DLC), carbon including nitrogen (CN), or another material including an inorganic insulating material. Alternatively, a siloxane resin may be used. A siloxane resin corresponds to a resin including a Si—O—Si bond. Siloxane has a skeleton structure constituted of bonds of silicon (Si) and oxygen (O). As a substituent, an organic group (e.g., an alkyl group or an aryl group) or a fluoro group may be used. A substituent may include a fluoro group. Further alternatively, an organic insulating material may be used. As an organic material, polyimide, acrylic, polyamide, polyimide amide, resist, benzocyclobutene, or polysilazane can be used. Further alternatively, a coating film which is formed by a coating method and has favorable planarity may also be used.

The insulating film 227 and the insulating layer 228 can be formed using dipping, spray coating, a doctor knife, a roll coater, a curtain coater, a knife coater, a CVD method, a vapor deposition method, or the like. Alternatively, the insulating film 227 and the insulating layer 228 may be formed by a droplet discharging method. If a droplet discharging method is used, consumption of a material liquid can be saved. Further alternatively, a method which enables transferring or drawing a pattern like a droplet discharging method, such as a printing method (a method of forming a pattern, such as screen printing or offset printing), can also be used.

Next, contact holes (openings) that reach the single crystal semiconductor layers are formed in the insulating film 227 and the insulating layer 228 using a mask made of a resist. Etching may be performed once or a plurality of times depending on etching selectivity of the material used. The insulating film 227 and the insulating layer 228 are partly removed by the etching, so that the openings that reach the second n-type impurity regions 219a and 219b and the second p-type impurity regions 224a and 224b, which are source regions and drain regions, are formed. For the etching, wet etching, dry etching, or both the kinds may be employed. As an etchant used in the wet etching, it is preferable to use a hydrofluoric-acid-based solution such as a mixed solution including ammonium hydrogen fluoride and ammonium fluoride. As an etching gas, a chlorine-based gas typified by $Cl_2$, $BCl_3$, $SiCl_4$, $CCl_4$, and the like; a fluorine-based gas typified by $CF_4$, $SF_6$, $NF_3$, and the like; or $O_2$ can be used as appropriate. In addition, an inert gas may be added to an etching gas to be used. As an inert element to be added, one or more kinds of elements selected from He, Ne, Ar, Kr, and Xe can be used.

A conductive film is formed to cover the openings, and is etched to form wiring layers 229a, 229b, 230a, and 230b, which are electrically connected to part of the source and drain regions and function as source electrode layers and drain electrode layers. The wiring layers can be formed by forming the conductive film by a PVD method, a CVD method, a vapor deposition method, or the like and then etching the conductive film into a desired shape. Alternatively, conductive layers can be selectively formed in given positions by a droplet discharging method, a printing method, an electrolytic plating method, or the like. Further alternatively, a reflow method or a damascene method may be used. The wiring layers are formed using a metal such as Ag, Au, Cu, Ni, Pt, Pd, Ir, Rh, W, Al, Ta, Mo, Cd, Zn, Fe, Ti, Zr, or Ba; Si, or Ge; or an alloy or nitride thereof. Alternatively, a stacked-layer structure thereof may be employed.

Figure 6A:
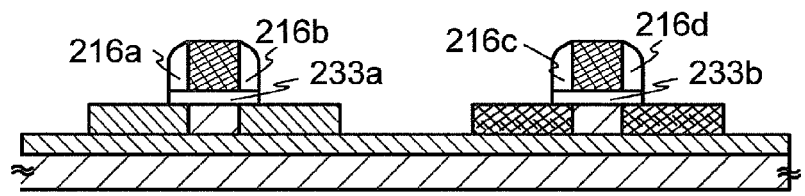
FIGS. 6A to 6D are drawings illustrating an example of a method for manufacturing a semiconductor device in which an SOI substrate is used.
Figure 6B:
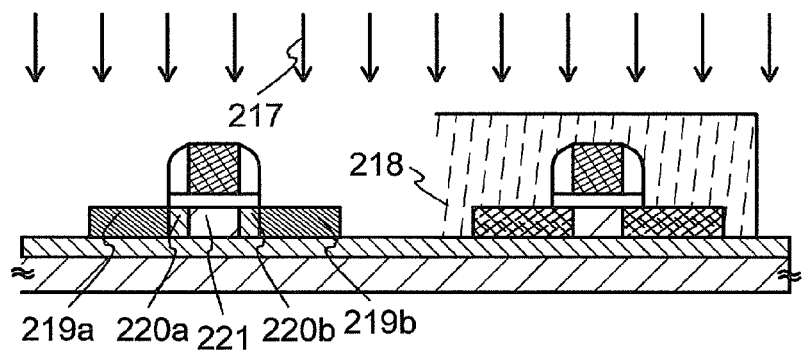
Figure 6C:
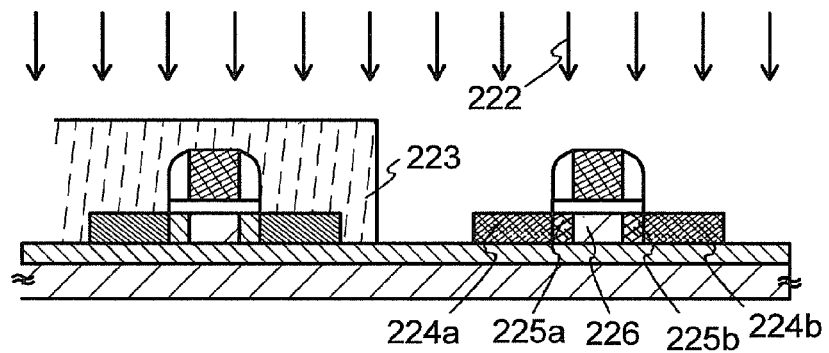
Figure 6D:
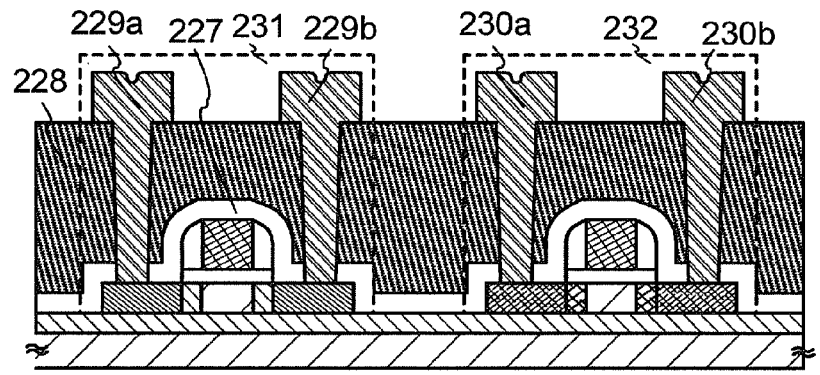

Through the above process, a semiconductor device with a CMOS structure which includes a thin film transistor 231, which is an n-channel thin film transistor, and a thin film transistor 232, which is a p-channel thin film transistor, can be formed (see FIG. 6D). Although not illustrated, the thin film transistors 231 and 232 are electrically connected to each other since a CMOS structure is presented in this embodiment mode.

The thin film transistor is not limited to this embodiment mode, and may have a single-gate structure, in which one channel formation region is formed, a double-gate structure, in which two channel formation region are formed, or a triple-gate structure, in which three channel formation regions are formed.

As described above, with the use of an SOI substrate having a single crystal semiconductor layer in which crystal defects are reduced and which has high planarity, semiconductor devices with high performance and high reliability can be manufactured in a high yield.

In this manner, a thin film transistor can be manufactured using an SOI substrate. The single crystal semiconductor layer of the SOI substrate has few crystal defects, a low interface state density with the gate insulating layer 207, a planarized surface, and a small thickness of less than or equal to 50 nm; thus, a thin film transistor with excellent characteristics such as low driving voltage, high field-effect mobility, and a low subthreshold value can be manufactured on the SOI substrate. Further, a plurality of transistors with high performance and little variation in characteristics can be formed on the same substrate. That is, the SOI substrate according to any one of Embodiment Modes 1 to 4 suppresses nonuniformity of characteristic values such as a threshold voltage or mobility, which are of importance as transistor characteristics, which leads to higher performance such as high field-effect mobility.

Consequently, by forming various semiconductor elements such as a TFT using the SOI substrate according to any one of Embodiment Modes 1 to 4, a semiconductor device with high added value can be manufactured.

A method for manufacturing a TFT has been described with reference to FIGS. 5A to 5E and FIGS. 6A to 6D; by forming various semiconductor elements such as a capacitor or a resistor in addition to the TFT, a semiconductor device with higher added value can be manufactured. Hereinafter, specific modes of a semiconductor device are described with reference to the drawings.

Figure 7:
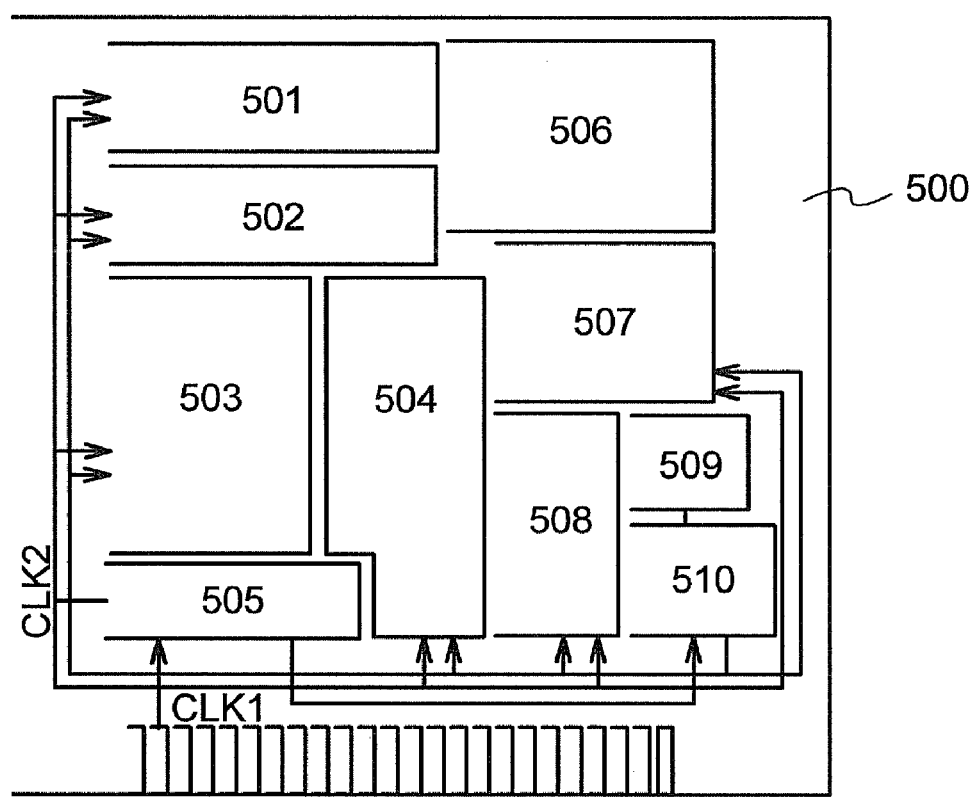
FIG. 7 is a drawing illustrating an example of a semiconductor device in which an SOI substrate is used.

First, as an example of a semiconductor device, a microprocessor is described. FIG. 7 is a block diagram illustrating a structural example of a microprocessor 500.

The microprocessor 500 includes an arithmetic logic unit (also referred to as an ALU) 501, an ALU controller 502, an instruction decoder 503, an interrupt controller 504, a timing controller 505, a register 506, a register controller 507, a bus interface (bus I/F) 508, a read-only memory 509, and a memory interface 510.

An instruction input to the microprocessor 500 through the bus interface 508 is input to the instruction decoder 503, decoded therein, and then input to the ALU controller 502, the interrupt controller 504, the register controller 507, and the timing controller 505. The ALU controller 502, the interrupt controller 504, the register controller 507, and the timing controller 505 carry out various controls based on the decoded instruction.

The ALU controller 502 generates a signal for controlling operation of the ALU 501. The interrupt controller 504 is a circuit which processes an interrupt request from an external input/output device or a peripheral circuit while the microprocessor 500 is executing a program; the interrupt controller 504 processes an interrupt request based on its priority or a mask state. The register controller 507 generates an address of the register 506, and reads or writes data from or to the register 506 in accordance with the state of the microprocessor 500. The timing controller 505 generates signals for controlling operation timing of the ALU 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As illustrated in FIG. 7, the internal clock signal CLK2 is input to another circuit.

Figure 8:
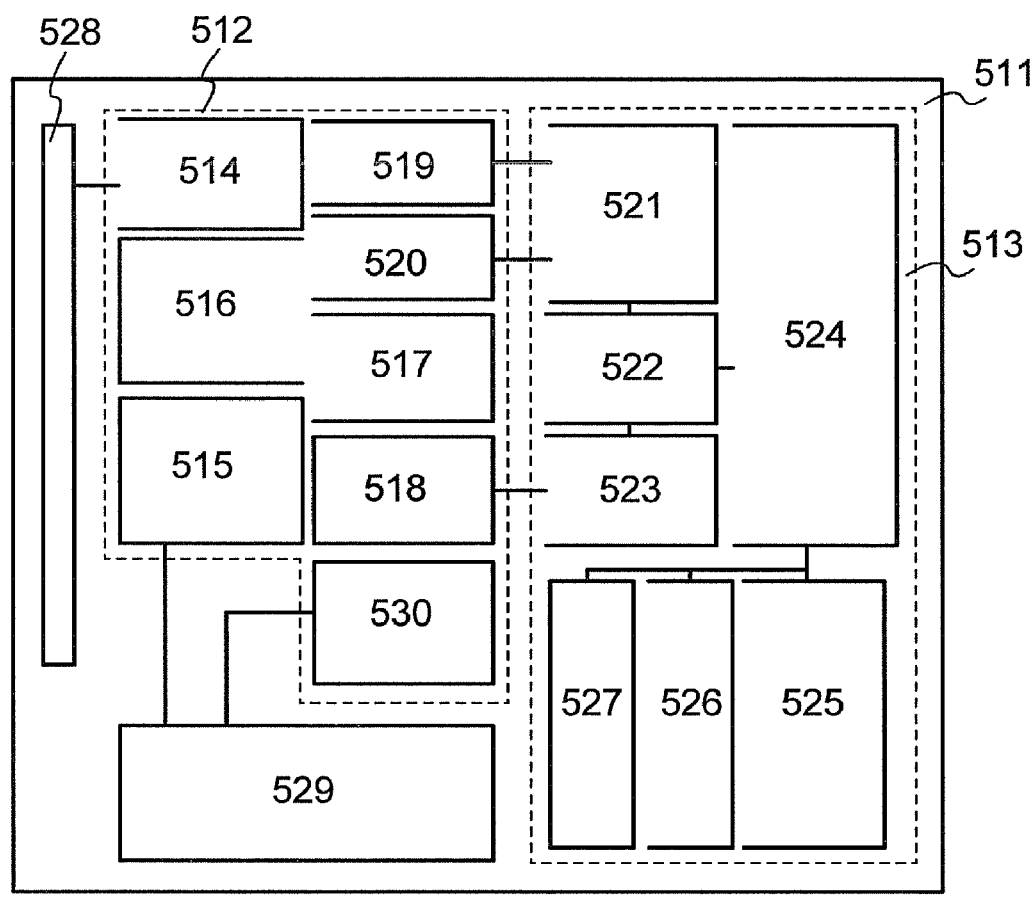
FIG. 8 is a drawing illustrating an example of a display device in which an SOI substrate is used.

Next, an example of a semiconductor device having a function of transmitting and receiving data without contact and an arithmetic function is described. FIG. 8 is a block diagram illustrating a structural example of such a semiconductor device. The semiconductor device illustrated in FIG. 8 can be referred to as a computer which operates by transmitting and receiving a signal to/from an external device by wireless communication (hereinafter referred to as "RFCPU").

As illustrated in FIG. 8, an RFCPU 511 includes an analog circuit portion 512 and a digital circuit portion 513. The analog circuit portion 512 includes a resonance circuit 514 having a resonance capacitor, a rectifier circuit 515, a constant voltage circuit 516, a reset circuit 517, an oscillator circuit 518, a demodulator circuit 519, and a modulator circuit 520.

The digital circuit portion 513 includes an RF interface 521, a control register 522, a clock controller 523, a CPU interface 524, a central processing unit 525, a random-access memory 526, and a read-only memory 527.

A summary of an operation of the RFCPU 511 is as follows. The resonance circuit 514 generates induced electromotive force based on a signal received by an antenna 528. A capacitor portion 529 is charged with the induced electromotive force through the rectifier circuit 515. It is preferable that this capacitor portion 529 be formed using a capacitor such as a ceramic capacitor or an electric double layer capacitor. The capacitor portion 529 is not necessarily integrated with a substrate of the RFCPU 511; it can also be incorporated in the RFCPU 511 as a separate component.

The reset circuit 517 generates a signal for resetting and initializing the digital circuit portion 513. For example, the reset circuit 517 generates, as a reset signal, a signal which rises with delay after an increase in a power supply voltage. The oscillator circuit 518 changes the frequency and duty ratio of a clock signal in response to a control signal generated by the constant voltage circuit 516. The demodulator circuit 519 demodulates a received signal, and the modulator circuit 520 modulates data to be transmitted.

For example, the demodulator circuit 519 is formed using a low-pass filter and binarizes a received amplitude-modulated (ASK) signal based on variation in the amplitude. The modulator circuit 520 changes the amplitude of a communication signal by changing a resonance point of the resonance circuit 514 in order to transmit transmission data with the amplitude of an amplitude-modulated (ASK) transmission signal varied.

The clock controller 523 generates a control signal for changing the frequency and duty ratio of a clock signal in accordance with a power supply voltage or a consumed current of the central processing unit 525. The power supply voltage is managed by a power management circuit 530.

A signal input from the antenna 528 to the RFCPU 511 is demodulated by the demodulator circuit 519 and then divided into a control command, data, and the like by the RF interface 521. The control command is stored in the control register 522. The control command includes reading of data stored in the read-only memory 527, writing of data to the random-access memory 526, an arithmetic instruction to the central processing unit 525, and the like.

The central processing unit 525 accesses the read-only memory 527, the random-access memory 526, and the control register 522 through the CPU interface 524. The CPU interface 524 has a function of generating an access signal for any of the read-only memory 527, the random-access memory 526, and the control register 522, based on an address requested by the central processing unit 525.

As an arithmetic method of the central processing unit 525, a method may be employed in which the read-only memory 527 stores an operating system (OS) and a program is read out and executed at the time of startup. Alternatively, a method may also be employed in which a dedicated arithmetic circuit is provided and arithmetic processing is carried out using hardware. In a method in which both hardware and software are used, part of arithmetic processing can be carried out with a dedicated arithmetic circuit and the other part of the arithmetic processing can be carried out with the central processing unit 525 using a program.

Next, display devices are described with reference to FIGS. 9A and 9B and FIGS. 10A and 10B.

Figure 9A:
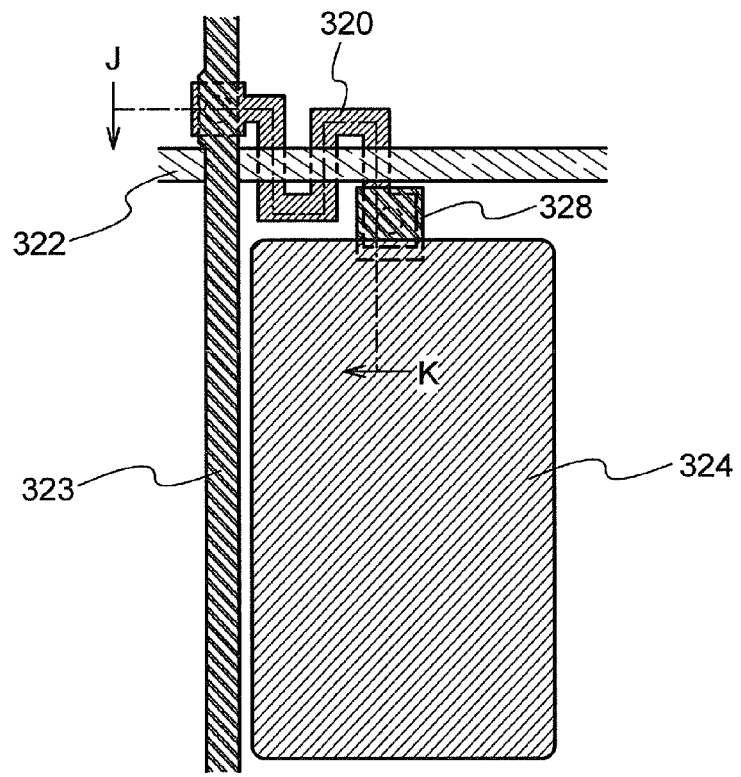
FIGS. 9A and 9B are drawings illustrating an example of a display device in which an SOI substrate is used.
Figure 9B:
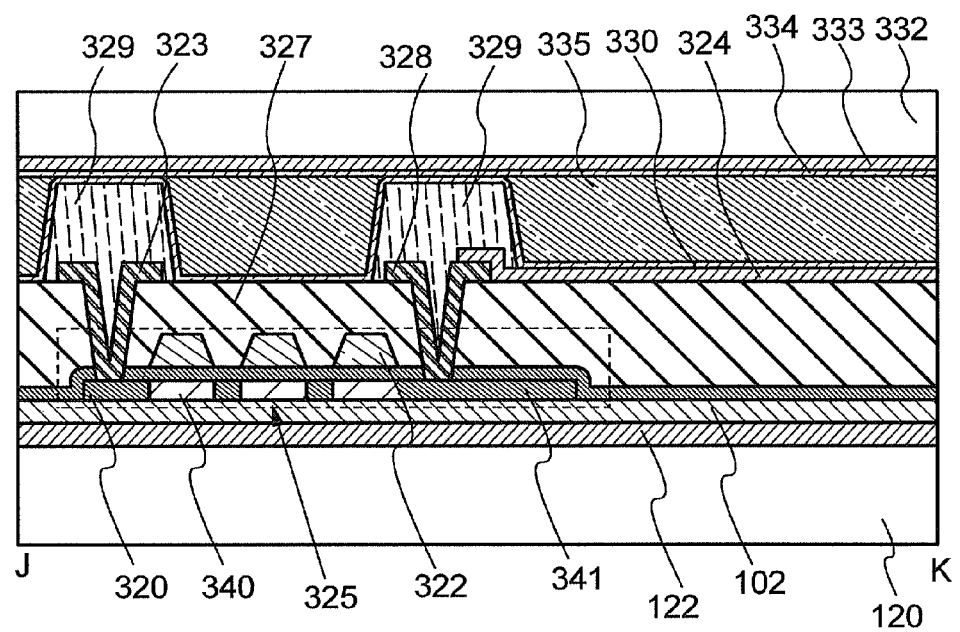

FIGS. 9A and 9B are drawings for illustrating a liquid crystal display device. FIG. 9A is a plan view of a pixel of the liquid crystal display device, and FIG. 9B is a cross-sectional view taken along a line J-K in FIG. 9A.

As illustrated in FIG. 9A, the pixel includes a single crystal semiconductor film 320, a scanning line 322 intersecting the single crystal semiconductor film 320, a signal line 323 intersecting the scanning line 322, a pixel electrode 324, and an electrode 328 that electrically connects the pixel electrode 324 and the single crystal semiconductor film 320. The single crystal semiconductor film 320 is a layer formed of a single crystal semiconductor film provided over a base substrate 120, and constitute a TFT 325 of the pixel.

For an SOI substrate, the SOI substrate presented in any of the preceding embodiment modes is used. As illustrated in FIG. 9B, the single crystal semiconductor film 320 is stacked over the base substrate 120 with a second insulating film 122 and a first insulating film 102 interposed therebetween. As the base substrate 120, a glass substrate can be used. The single crystal semiconductor film 320 of the TFT 325 is formed by element isolation of a single crystal semiconductor film of an SOI substrate by etching. Channel formation regions 340, and n-type high-concentration impurity regions 341, to which an impurity element is added, are formed in the single crystal semiconductor film 320. A gate electrode of the TFT 325 is included in the scanning line 322, and either a source electrode or a drain electrode of the TFT 325 is included in the signal line 323.

The signal line 323, the pixel electrode 324, and the electrode 328 are provided over an interlayer insulating film 327. Columnar spacers 329 are formed over the interlayer insulating film 327. An alignment film 330 is formed to cover the signal line 323, the pixel electrode 324, the electrode 328, and the columnar spacers 329. A counter substrate 332 is provided with a counter electrode 333 and an alignment film 334 covering the counter electrode. The columnar spacers 329 are formed to maintain a space between the base substrate 120 and the counter substrate 332. A liquid crystal layer 335 is formed in the space formed with the columnar spacers 329. Since contact holes produce a difference in height at connection portions of the signal line 323 and the high-concentration impurity region 341 and of the electrode 328 and the high-concentration impurity region 341 in the interlayer insulating film 327, alignment of liquid crystals of the liquid crystal layer 335 tends to be disordered in the connection portions; therefore, the columnar spacers 329 are formed in the portions with the difference in height to prevent alignment disorder of the liquid crystals.

Figure 10A:
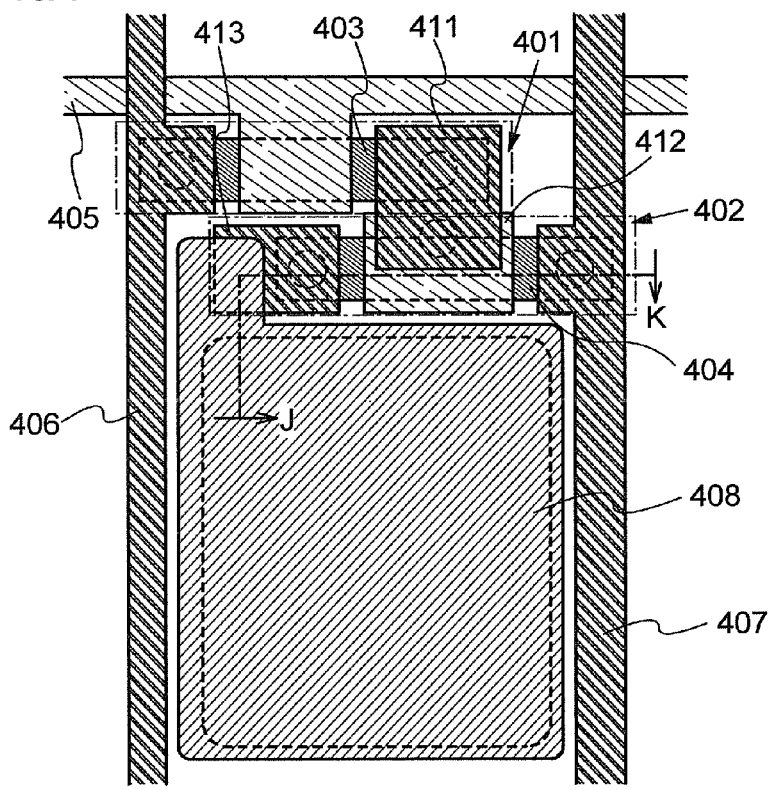
FIGS. 10A and 10B are drawings illustrating an example of a display device in which an SOI substrate is used.
Figure 10B:
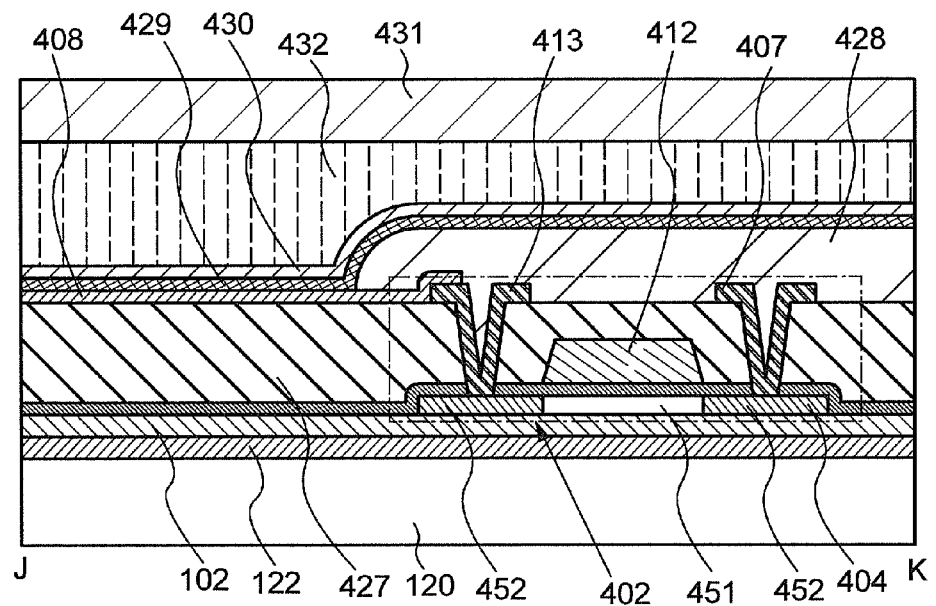

Next, an electroluminescent display device (hereinafter referred to as an "EL display device") is described with reference to FIGS. 10A and 10B. FIG. 10A is a plan view of a pixel of the EL display device, and FIG. 10B is a cross-sectional view taken along a line J-K in FIG. 10A.

As illustrated in FIG. 10A, the pixel includes a selection transistor 401 and a display control transistor 402, which are TFTs; a scanning line 405; a signal line 406; a current supply line 407; and a pixel electrode 408. Each pixel is provided with a light-emitting element in which a layer including an electroluminescent material (an EL layer) is sandwiched between a pair of electrodes. One electrode of the light-emitting element is the pixel electrode 408. Further, a channel formation, a source region, and a drain region of the selection transistor 401 are formed in a semiconductor film 403. A channel formation region, a source region, and a drain region of the display control transistor 402 are formed in a semiconductor film 404. The semiconductor films 403 and 404 are formed using a single crystal semiconductor film formed over a base substrate.

In the selection transistor 401, a gate electrode is included in the scanning line 405; one of a source electrode and a drain electrode is included in the signal line 406; and the other thereof is formed as an electrode 411. In the display control transistor 402, a gate electrode 412 is electrically connected to the electrode 411; one of a source electrode and a drain electrode is formed as an electrode 413 that is electrically connected to the pixel electrode 408; and the other thereof is included in the current supply line 407.

The display control transistor 402 is a p-channel TFT. As illustrated in FIG. 10B, a channel formation region 451 and p-type high-concentration impurity regions 452 are formed in the semiconductor film 404. For an SOI substrate, the SOI substrate presented in any of Embodiment Modes 1 to 4 is used.

An interlayer insulating film 427 is formed to cover the gate electrode 412 of the display control transistor 402. The signal line 406, the current supply line 407, the electrodes 411 and 413, and the like are formed over the interlayer insulating film 427. Further, the pixel electrode 408 that is electrically connected to the electrode 413 is formed over the interlayer insulating film 427. A periphery portion of the pixel electrode 408 is surrounded with an insulating partition layer 428. An EL layer 429 is formed over the pixel electrode 408, and a counter electrode 430 is formed over the EL layer 429. A counter substrate 431 is provided as a reinforcing plate, and is fixed to a base substrate 120 with a resin layer 432.

The grayscale of an EL display device is controlled by either a current drive method, in which the luminance of a light-emitting element is controlled with the amount of current, or a voltage drive method, in which the luminance is controlled with the level of voltage. When transistors vary widely in characteristic value from pixel to pixel, it is difficult to employ a current drive method; if a current drive method is employed, a correction circuit, which corrects variation in characteristics, is necessary. By manufacturing the EL display device by a manufacturing method including a manufacturing process of an SOI substrate and a gettering process, the selection transistor 401 and the display control transistor 402 do not have variation in characteristics from pixel to pixel; thus, a current drive method can be employed.

That is, the SOI substrate makes it possible to manufacture a variety of electric appliances. Examples of the electric appliances include a video camera, a digital camera, a navigation system, a sound reproducing device (e.g., a car audio or an audio component), a computer, a game machine, a portable information terminal (e.g., a mobile computer, a mobile phone, a mobile game machine, or an electronic book), an image reproducing device having a recording medium (specifically, a device which reproduces audio data stored in a recording medium such as a digital versatile disc (DVD) and has a display device for displaying stored image data), and the like. An example thereof is illustrated in FIGS. 11A to 11C.

Figure 11A:
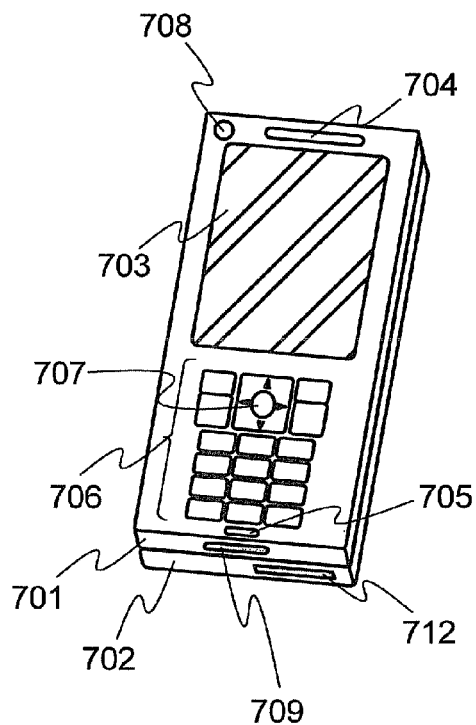
FIGS. 11A to 11C are drawings illustrating an example of an electronic appliance in which an SOI substrate is used.
Figure 11B:
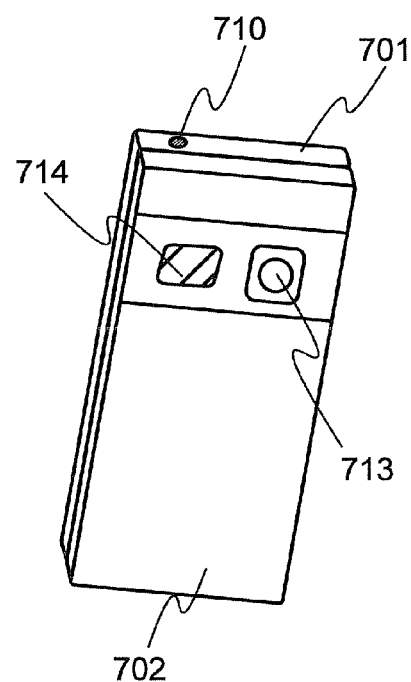
Figure 11C:
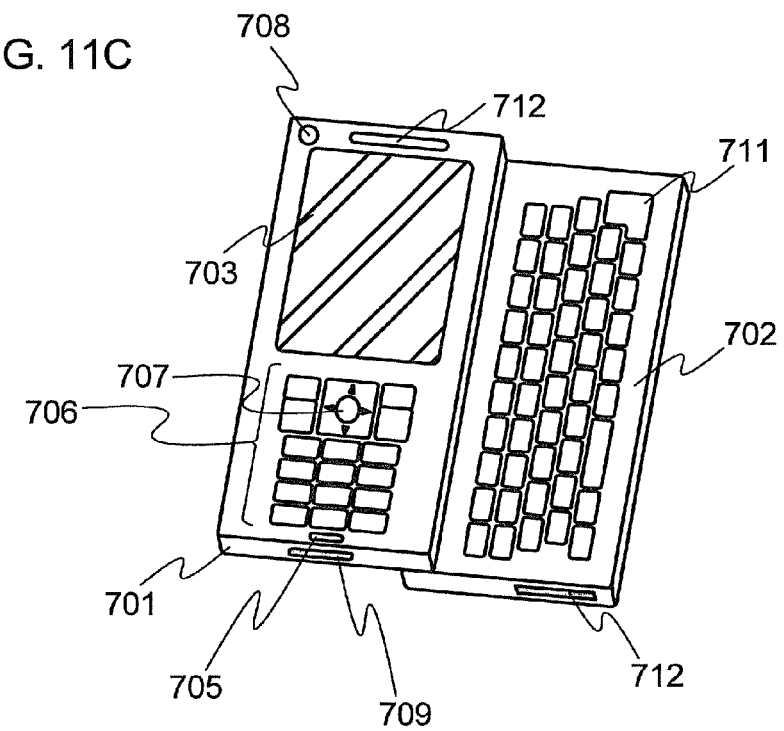

FIGS. 11A to 11C illustrate an example of a mobile phone to which the SOI substrate according to any one of Embodiment Modes 1 to 4 is applied. FIG. 11A is a front view, and FIG. 11B is a rear view, and FIG. 11C is a front view in which two chassis are slid out. A mobile phone has two chassis 701 and 702. The mobile phone has both functions of a mobile phone and a portable information terminal, and incorporates a computer. The mobile phone is a "smartphone," with which a variety of data processing is possible in addition to telephone conversation.

The mobile phone has the chassis 701 and 702. The chassis 701 includes a display portion 703, a speaker 704, a microphone 705, operation keys 706, a pointing device 707, a front camera lens 708, a jack 709 for an external connection terminal, an earphone terminal 710, and the like. The chassis 702 includes a keyboard 711, an external memory slot 712, a rear camera 713, a light 714, and the like. In addition, an antenna is incorporated in the chassis 701.

Further, in addition to the above structure, the mobile phone may incorporate a non-contact IC chip, a small memory device, or the like.

The chassis 701 and 702 which overlap with each other (see FIG. 11A) can be slid out, and are developed by being slid out as illustrated in FIG. 11C. A display panel or a display device that is manufactured according to any of the methods for manufacturing a display device in Embodiment Mode 5 can be incorporated in the display portion 703. Since the front camera lens 708 and the display portion 703 are provided in the same face, the mobile phone can be used as a videophone. Further, a still image and a moving image can be taken with the rear camera 713 and the light 714, with the display portion 703 used as a viewfinder.

With the use of the speaker 704 and the microphone 705, the mobile phone can be used as an audio recording device (recording device) or an audio reproducing device. With the use of the operation keys 706, further, operations of incoming and outgoing of calls, simple information input such as electronic mail, scrolling of a screen in the display portion, cursor movement, e.g., for selecting information to be displayed in the display portion, and the like are possible.

If much information needs to be treated in documentation, a use as a portable information terminal, and the like, it is convenient to use the keyboard 711. By sliding out the chassis 701 and 702 which overlap with each other (see FIG. 11A), the chassis 701 and 702 can be developed as illustrated in FIG. 11C. In using the mobile phone as a portable information terminal, smooth operation is possible with the use of the keyboard 711 and the pointing device 707. The jack 709 for an external connection terminal can be connected to an AC adapter or a variety of cables such as a USB cable, and charging and data communication with a personal computer or the like is possible. Further, by inserting a recording medium in the external memory slot 712, a larger amount of data can be stored and transferred.

The rear face of the chassis 702 (see FIG. 11B) is provided with the rear camera 713 and the light 714, and a still image and a moving image can be taken with the display portion 703 used as a viewfinder.

Further, the mobile phone may have an infrared communication function, a USB port, a function of receiving one segment television broadcast, a non-contact IC chip, an earphone jack, or the like, in addition to the above functions and structures.

The variety of electronic appliances described in this embodiment mode can be manufactured by the method for manufacturing a thin film transistor and a display device in Embodiment Mode 5; therefore, application of the SOI substrate according to any one of Embodiment Modes 1 to 4 can improve display characteristics and productivity of these electronic appliances.

Embodiment 1

This embodiment describes an oxide film including chlorine that is presented in the preceding embodiment modes.

First, a single crystal silicon substrate was prepared as a single crystal semiconductor substrate and underwent a thermal treatment in an oxidation atmosphere to which hydrogen chloride was added, so that an oxide film (a HCl thermal oxide $SiO_2$) was formed on the single crystal silicon substrate.

Subsequently, the single crystal silicon substrate was irradiated with hydrogen ions through the oxide film by an ion doping method, whereby an embrittlement layer was formed at a predetermined depth from a surface of the single crystal semiconductor substrate. Then, the oxide film underwent an $O_2$ plasma treatment. Next, a single crystal silicon substrate was prepared as a semiconductor substrate, and was bonded to the oxide film. Then, a thermal treatment was performed to separate the single crystal silicon substrate along the embrittlement layer, so that an SOI substrate was manufactured in which a single crystal silicon film was formed over the single crystal silicon substrate with the oxide film interposed therebetween.

The thermal oxidation treatment was performed in an oxidation atmosphere which includes hydrogen chloride (HCl) at 3 volume % ($HCl/O_2$) with respect to oxygen, at 950° C. for 210 minutes. As a result, the oxide film with a thickness of 100 nm was formed. Further, the thermal treatment after the bonding was performed using a thermal treatment furnace at a heating temperature of 200° C. for 2 hours, and furthermore at 600° C. for 2 hours. The single crystal silicon film, which was obtained by the separation, had a thickness of 130 nm.

After that, the concentration of chlorine included in the oxide film was measured by secondary ion mass spectroscopy (SIMS).

FIG. 12 illustrates depth profile of a chlorine concentration in the oxide film formed on the single crystal silicon substrate which was measured by SIMS. In FIG. 12, the values of the chlorine concentration are effective only in the oxide film (HCl thermal oxide $SiO_2$).

FIG. 12 demonstrates that chlorine included in the oxide film was included in a large amount at an interface with the single crystal silicon film.

Embodiment 2

This embodiment describes a state of a single crystal semiconductor layer that is formed over a base substrate by performing a plasma treatment on an oxide film formed on a single crystal semiconductor substrate, bonding the oxide film formed on the single crystal semiconductor substrate to a base substrate, and separating the single crystal semiconductor substrate.

Samples evaluated in this embodiment are described. First, with two single crystal silicon substrates used as the single crystal semiconductor substrates, each surface of the single crystal silicon substrates underwent a thermal treatment in an oxidation atmosphere to which hydrogen chloride was added, whereby an oxide film (HCl thermal oxide $SiO_2$) was formed on each of the single crystal silicon substrates. Next, each single crystal silicon substrate was irradiated with hydrogen ions through the oxide film by an ion doping method, so that an embrittlement layer was formed in each of the single crystal silicon substrates. The detailed condition was as follows: an ion doping apparatus was used; the acceleration voltage was 40 kV; the dose was $2.2 \times 10^{16}$ ions/$cm^2$; the beam current density was 2 μA/$cm^2$.

Next, the oxide film (on the side in which the embrittlement layer was formed) that had been irradiated with the hydrogen ions underwent a plasma treatment. The plasma treatment was performed under the following two conditions: under a condition 1, an ICP plasma apparatus was used, and the plasma treatment was performed for 30 seconds with treatment power of 1800 W, a pressure of 66.5 Pa, and an oxygen gas flow rate of 300 sccm; under a condition 2, an RIE apparatus was used, and the plasma treatment was performed for 30 seconds with electric power of 0.24 W/$cm^2$(=input power 200 W/a lower electrode 819 $cm^2$), a pressure of 66.7 Pa, and an oxygen gas flow rate of 300 sccm.

Next, the oxide film that had undergone the plasma treatment was bonded to a base substrate. Then, a thermal treatment was performed to separate the single crystal silicon substrate along the embrittlement layer, so that an SOI substrate was manufactured in which a single crystal silicon layer was formed over the base substrate with the oxide film interposed therebetween. As the base substrate, a single crystal silicon substrate was used. The SOI substrate which underwent the plasma treatment under the condition 1 is Sample A, and the SOI substrate which underwent the plasma treatment under the condition 2 is Sample B.

Figure 13A:
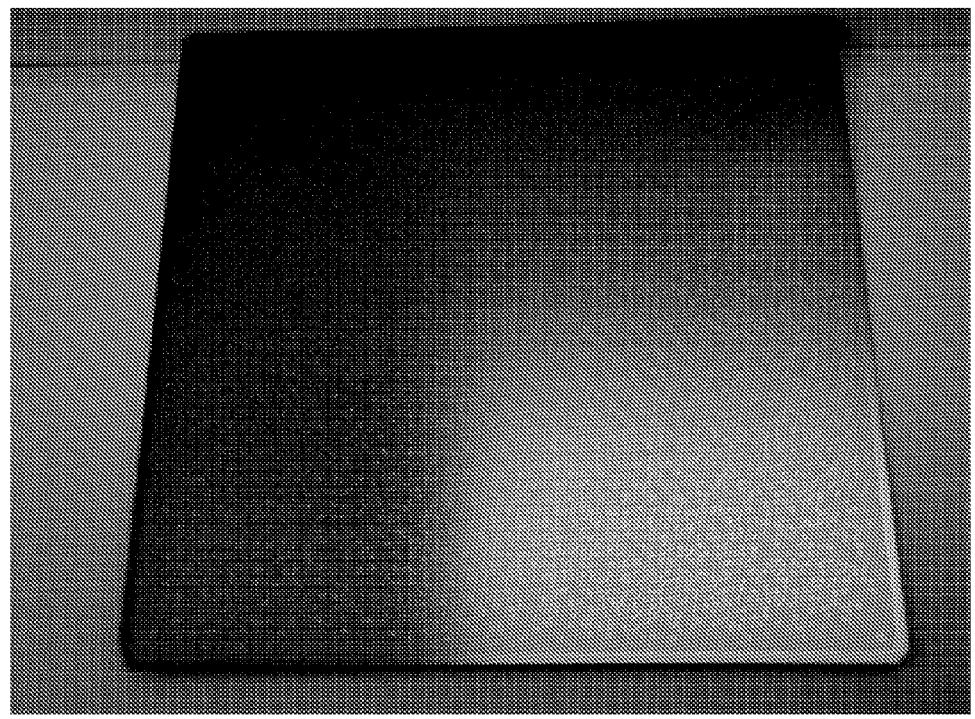
FIGS. 13A and 13B are a picture of a surface of a single crystal silicon layer formed over a base substrate and an enlarged picture thereof, respectively.
Figure 13B:
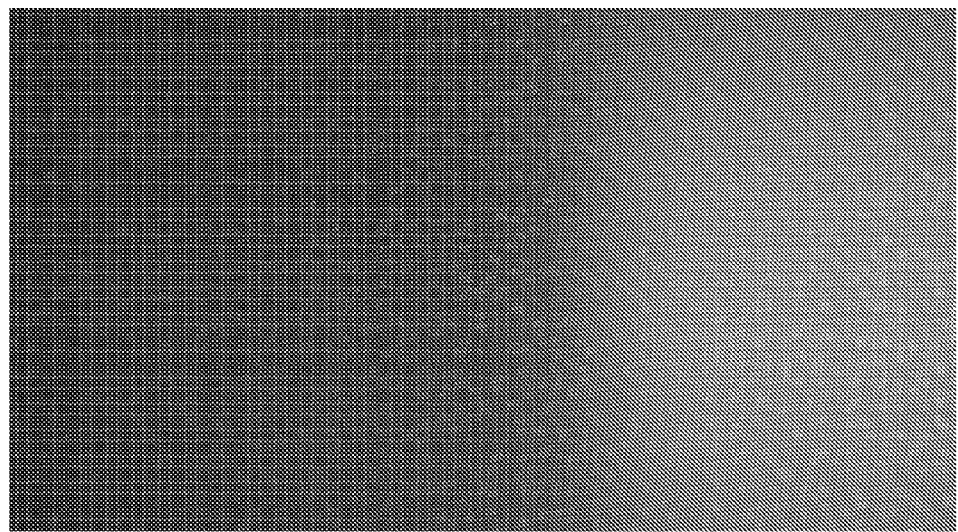
Figure 14A:
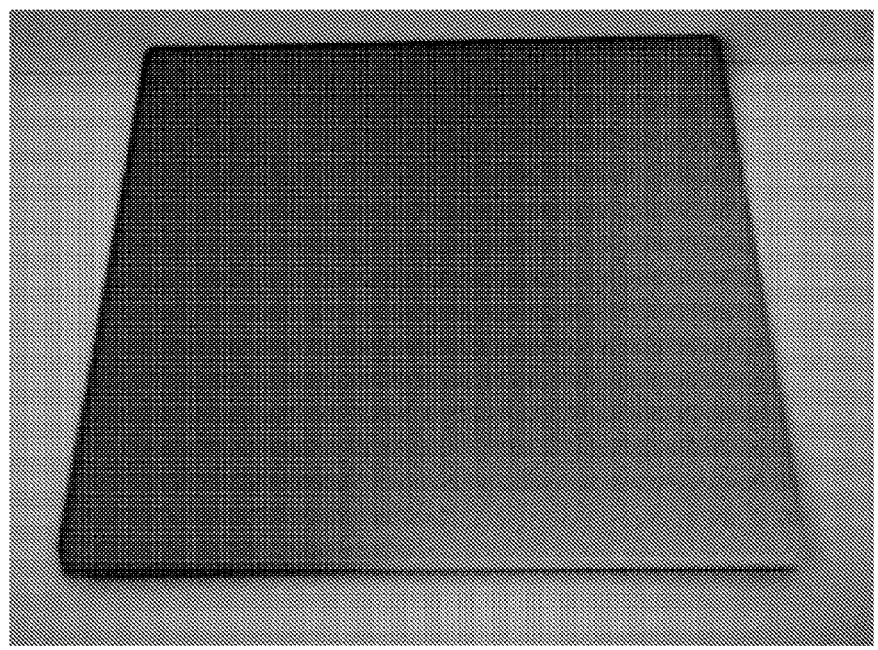
FIGS. 14A and 14B are a picture of a surface of a single crystal silicon layer formed over a base substrate and an enlarged picture thereof, respectively.
Figure 14B:
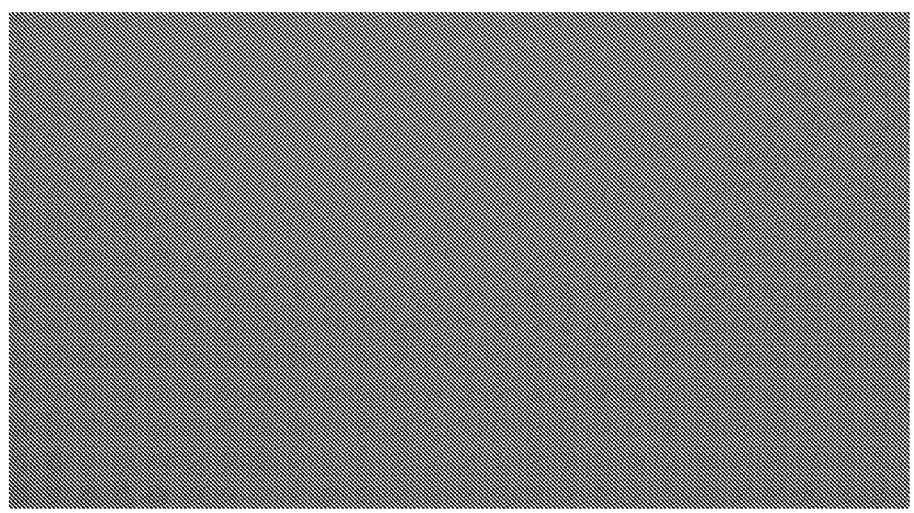

FIGS. 13A and 13B and FIGS. 14A and 14B show the single crystal silicon layers that underwent the bonding. FIG. 13A shows a surface of the single crystal silicon layer of Sample A, and FIG. 13B is an enlarged view of FIG. 13A. FIG. 14A shows a surface of the single crystal silicon layer of Sample B, and FIG. 14B is an enlarged view of FIG. 14A.

In the case where the bonding was performed after the oxide film underwent the plasma treatment under the condition 1, a plurality of defects were observed in the single crystal silicon layer formed over the base substrate (see FIG. 13B). In the case of the condition 1, it is probable that bias was not applied, which hindered the oxide film from being irradiated with the ions.

On the other hand, in the case where the bonding was performed after the oxide film underwent the plasma treatment under the condition 2, few defects were observed in the single crystal silicon layer formed over the base substrate, and it was observed that the oxide film had been bonded to the base substrate favorably (see FIGS. 14A and 14B). When an RIE method is used, as the power becomes higher, the density of generated plasma becomes higher and bias also becomes higher. Therefore, it is probable that the oxide film was irradiated to a deep portion with the ions. Further, it is probable that sufficient Si—O bonds turned into Si—OH bonds. Furthermore, it is probable that sufficient distortion was formed by the ion irradiation, which promoted diffusion or absorption of water in the thermal treatment.

The above result confirmed that by performing a plasma treatment on a bonding surface by applying a bias voltage thereto, the bonding strength between an oxide film and a base substrate is improved and defects are reduced in a single crystal semiconductor layer obtained over the base substrate.

Embodiment 3

This embodiment describes a change in surface characteristics when an oxide film formed on a single crystal semiconductor substrate undergoes a plasma treatment.

Samples evaluated in this embodiment are described. As Sample C, a single crystal silicon substrate was used as the single crystal semiconductor substrate, and a surface thereof underwent a thermal treatment in an oxidation atmosphere to which hydrogen chloride was added, so that an oxide film with a thickness of 100 nm was formed on the single crystal silicon substrate.

As Sample D, in a similar manner to Sample C, a single crystal silicon substrate was used and a surface thereof underwent a thermal treatment in an oxidation atmosphere to which hydrogen chloride was added, so that an oxide film with a thickness of 100 nm was formed on the single crystal silicon substrate. After that, the oxide film was irradiated with hydrogen ions. The condition of the hydrogen ion irradiation was as follows: an RF discharge ion doping apparatus was used; the hydrogen gas flow rate was 30 sccm; the power output was 100 W; the acceleration voltage was 40 kV; the dose was $2.0 \times 10^{16}$ ions/cm$^2$.

As Sample E, in a similar manner to Sample C, a single crystal silicon substrate was used and a surface thereof underwent a thermal treatment in an oxidation atmosphere to which hydrogen chloride was added, so that an oxide film with a thickness of 100 nm was formed on the single crystal silicon substrate. After that, the oxide film was irradiated with hydrogen ions. The condition of the hydrogen ion irradiation was similar to that of Sample D. After that, a surface of the oxide film underwent a plasma treatment. The condition of the plasma treatment was as follows: an apparatus manufactured by Tegal Corporation (981ACS, a plasma dry etching apparatus) was used; a reactive ion etching (RIE) mode was employed; the electric power for the treatment was 200 W; the pressure was 66.7 Pa; the gas ($O_2$) flow rate was 100 sccm; the treatment time was 30 seconds.

Figure 15:
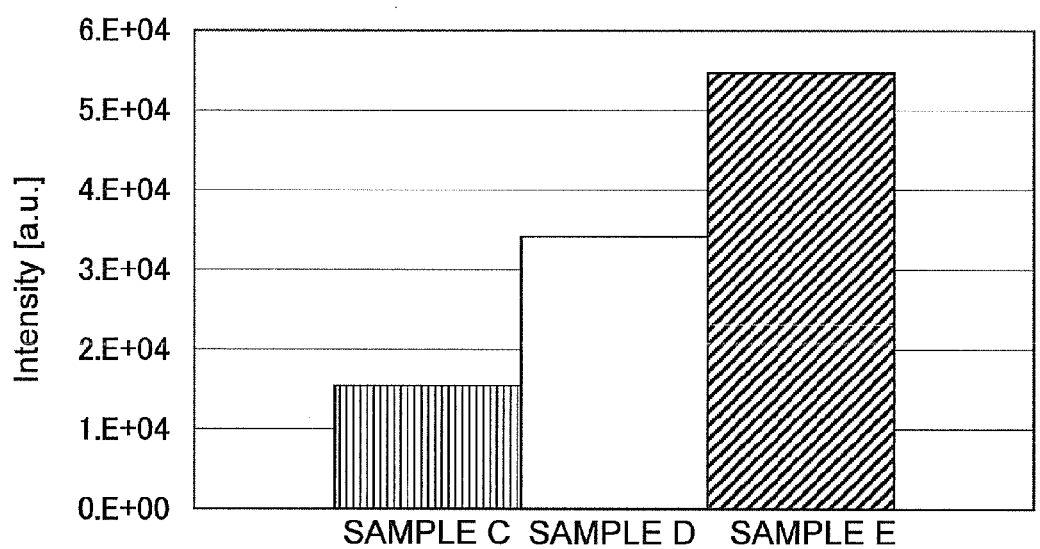
FIG. 15 is a graph showing a measurement result of ToF-SIMS of an oxide film formed over a single crystal silicon substrate.

Then, the surfaces of the oxide films of Samples C, D, and E underwent qualitative analysis by time of flight secondary ion mass spectrometry (ToF-SIMS). FIG. 15 shows an analysis result of the surfaces of the oxide films of Samples C, D, and E. The horizontal axis shows Samples C, D, and E, and the vertical axis shows the intensity of ($SiO_2$)n-OH-based negative ions.

The result confirmed that the oxide film of Sample E, which had undergone the plasma treatment, had higher intensity of ($SiO_2$)n-OH-based ions than Sample C or D, which had not undergone a plasma treatment. That is, the result confirmed that collision between accelerated oxygen cations and an oxide film reduces Si—H, Si—$H_2$, and $SiO_2$, and increases ($SiO_2$)n-OH.

This application is based on Japanese Patent Application serial No. 2008-024608 filed with Japan Patent Office on Feb. 4, 2008, the entire contents of which are hereby incorporated by reference.

What is claimed is:

1. A method for manufacturing an SOI substrate, comprising:
    forming an insulating film including halogen on a surface of a single crystal semiconductor substrate by performing a thermal oxidation treatment in an atmosphere including halogen;
    forming an embrittlement layer in the single crystal semiconductor substrate by irradiating the single crystal semiconductor substrate with ions through the insulating film including halogen;
    performing a plasma treatment on the insulating film including halogen by applying a bias voltage to the insulating film including halogen;
    bonding the insulating film including halogen and a face of a semiconductor substrate with each other;
    splitting the single crystal semiconductor substrate along the embrittlement layer, whereby a single crystal semiconductor layer is bonded to the semiconductor substrate; and
    performing a planarization treatment on the single crystal semiconductor layer bonded to the semiconductor substrate.

2. The method for manufacturing an SOI substrate according to claim 1,
    wherein a hydrogen gas is used for forming the embrittlement layer, and
    wherein the hydrogen gas is excited to produce plasma including $H_3^+$, and ions included in the plasma are accelerated to irradiate the single crystal semiconductor substrate with the ions, whereby the embrittlement layer is formed.

3. The method for manufacturing an SOI substrate according to claim 1, wherein the insulating film including halogen comprises silicon oxide.

4. The method for manufacturing an SOI substrate according to claim 1, wherein the halogen is at a concentration from $1 \times 10^{16}$ atoms/cm$^3$ to $2 \times 10^{21}$ atoms/cm$^3$, inclusive.

5. The method for manufacturing an SOI substrate according to claim 1, wherein the halogen is chlorine.

6. The method for manufacturing an SOI substrate according to claim 1, wherein oxygen is used as a gas used for the plasma treatment.

7. The method for manufacturing an SOI substrate according to claim 1, wherein the semiconductor substrate is a single crystal silicon substrate, a polycrystalline silicon substrate, or a solar-grade silicon substrate.

8. The method for manufacturing an SOI substrate according to claim 1, wherein the SOI substrate is incorporated in one selected from the group consisting of a phone, a camera, a game machine, and an audio reproducing device.

9. A method for manufacturing an SOI substrate, comprising:
    forming an embrittlement layer in a single crystal semiconductor substrate by irradiating the single crystal semiconductor substrate with ions;
    forming an insulating film including halogen on a surface of a semiconductor substrate by performing a thermal oxidation treatment in an atmosphere including halogen;
    performing a plasma treatment on the insulating film including halogen by applying a bias voltage to the insulating film including halogen;
    bonding the insulating film including halogen and a face of the single crystal semiconductor substrate with each other;
    splitting the single crystal semiconductor substrate along the embrittlement layer, whereby a single crystal semiconductor layer is bonded to the semiconductor substrate; and
    performing a planarization treatment on the single crystal semiconductor layer bonded to the semiconductor substrate.

10. The method for manufacturing an SOI substrate according to claim 9,
    wherein a hydrogen gas is used for forming the embrittlement layer, and
    wherein the hydrogen gas is excited to produce plasma including $H_3^+$, and ions included in the plasma are accelerated to irradiate the single crystal semiconductor substrate with the ions, whereby the embrittlement layer is formed.

11. The method for manufacturing an SOI substrate according to claim 9, wherein the insulating film including halogen comprises silicon oxide.

12. The method for manufacturing an SOI substrate according to claim 9, wherein the halogen is at a concentration from $1 \times 10^{16}$ atoms/cm$^3$ to $2 \times 10^{21}$ atoms/cm$^3$, inclusive.

13. The method for manufacturing an SOI substrate according to claim 9, wherein the halogen is chlorine.

14. The method for manufacturing an SOI substrate according to claim 9, wherein oxygen is used as a gas used for the plasma treatment.

15. The method for manufacturing an SOI substrate according to claim 9, wherein the semiconductor substrate is a single crystal silicon substrate, a polycrystalline silicon substrate, or a solar-grade silicon substrate.

16. The method for manufacturing an SOI substrate according to claim 9, wherein the SOI substrate is incorporated in one selected from the group consisting of a phone, a camera, a game machine, and an audio reproducing device.

17. A method for manufacturing an SOI substrate, comprising:
forming an insulating film including halogen on a surface of a single crystal semiconductor substrate by performing a thermal oxidation treatment in an atmosphere including halogen;
forming an embrittlement layer in the single crystal semiconductor substrate by irradiating the single crystal semiconductor substrate with ions through the insulating film including halogen;
performing a plasma treatment on the insulating film including halogen by applying a bias voltage to the insulating film including halogen;
forming an insulating film on a surface of a semiconductor substrate by performing a thermal oxidation treatment on the surface of the semiconductor substrate;
bonding the insulating film including halogen and a face of the insulating film with each other;
splitting the single crystal semiconductor substrate along the embrittlement layer, whereby a single crystal semiconductor layer is bonded to the semiconductor substrate; and
performing a planarization treatment on the single crystal semiconductor layer bonded to the semiconductor substrate.

18. The method for manufacturing an SOI substrate according to claim 17,
wherein a hydrogen gas is used for forming the embrittlement layer, and
wherein the hydrogen gas is excited to produce plasma including $H_3^+$, and ions included in the plasma are accelerated to irradiate the single crystal semiconductor substrate with the ions, whereby the embrittlement layer is formed.

19. The method for manufacturing an SOI substrate according to claim 17, wherein the insulating film including halogen comprises silicon oxide.

20. The method for manufacturing an SOI substrate according to claim 17, wherein the halogen is at a concentration from $1 \times 10^{16}$ atoms/cm$^3$ to $2 \times 10^{21}$ atoms/cm$^3$, inclusive.

21. The method for manufacturing an SOI substrate according to claim 17, wherein the halogen is chlorine.

22. The method for manufacturing an SOI substrate according to claim 17, wherein oxygen is used as a gas used for the plasma treatment.

23. The method for manufacturing an SOI substrate according to claim 17, wherein the semiconductor substrate is a single crystal silicon substrate, a polycrystalline silicon substrate, or a solar-grade silicon substrate.

24. The method for manufacturing an SOI substrate according to claim 17, wherein the SOI substrate is incorporated in one selected from the group consisting of a phone, a camera, a game machine, and an audio reproducing device.

25. A method for manufacturing an SOI substrate, comprising:
forming an insulating film on a surface of a single crystal semiconductor substrate by performing a thermal oxidation treatment on the single crystal semiconductor substrate;
forming an embrittlement layer in the single crystal semiconductor substrate by irradiating the single crystal semiconductor substrate with ions through the insulating film;
forming an insulating film including halogen on a surface of a semiconductor substrate by performing a thermal oxidation treatment in an atmosphere including halogen;
performing a plasma treatment on the insulating film including halogen by applying a bias voltage to the insulating film including halogen;
bonding the insulating film including halogen and a face of the insulating film with each other;
splitting the single crystal semiconductor substrate along the embrittlement layer, whereby a single crystal semiconductor layer is bonded to the semiconductor substrate; and
performing a planarization treatment on the single crystal semiconductor layer bonded to the semiconductor substrate.

26. The method for manufacturing an SOI substrate according to claim 25,
wherein a hydrogen gas is used for forming the embrittlement layer, and
wherein the hydrogen gas is excited to produce plasma including $H_3^+$, and ions included in the plasma are accelerated to irradiate the single crystal semiconductor substrate with the ions, whereby the embrittlement layer is formed.

27. The method for manufacturing an SOI substrate according to claim 25, wherein the insulating film including halogen comprises silicon oxide.

28. The method for manufacturing an SOI substrate according to claim 25, wherein the halogen is at a concentration from $1 \times 10^{16}$ atoms/cm$^3$ to $2 \times 10^{21}$ atoms/cm$^3$, inclusive.

29. The method for manufacturing an SOI substrate according to claim 25, wherein the halogen is chlorine.

30. The method for manufacturing an SOI substrate according to claim 25, wherein oxygen is used as a gas used for the plasma treatment.

31. The method for manufacturing an SOI substrate according to claim 25, wherein the semiconductor substrate is a single crystal silicon substrate, a polycrystalline silicon substrate, or a solar-grade silicon substrate.

32. The method for manufacturing an SOI substrate according to claim 25, wherein the SOI substrate is incorporated in one selected from the group consisting of a phone, a camera, a game machine, and an audio reproducing device.

33. A method for manufacturing an SOI substrate, comprising:
forming a first insulating film on a surface of a single crystal semiconductor substrate by performing a thermal oxidation treatment;
forming an embrittlement layer in the single crystal semiconductor substrate by irradiating the single crystal semiconductor substrate with ions through the first insulating film;
forming a second insulating film on the first insulating film;
performing a plasma treatment on the second insulating film by applying a bias voltage to the second insulating film;
forming a third insulating film including halogen on a surface of a semiconductor substrate by performing a thermal oxidation treatment in an atmosphere including halogen;
bonding the third insulating film including halogen and a face of the second insulating film with each other;

splitting the single crystal semiconductor substrate along the embrittlement layer, whereby a single crystal semiconductor layer is bonded to the semiconductor substrate; and performing a planarization treatment on the single crystal semiconductor layer bonded to the semiconductor substrate.

34. The method for manufacturing an SOI substrate according to claim 33, wherein a hydrogen gas is used for forming the embrittlement layer, and wherein the hydrogen gas is excited to produce plasma including $H_3^+$, and ions included in the plasma are accelerated to irradiate the single crystal semiconductor substrate with the ions, whereby the embrittlement layer is formed.

35. The method for manufacturing an SOI substrate according to claim 33, wherein the third insulating film including halogen comprises silicon oxide.

36. The method for manufacturing an SOI substrate according to claim 33, wherein the halogen is at a concentration from $1\times10^{16}$ atoms/cm$^3$ to $2\times10^{21}$ atoms/cm$^3$, inclusive.

37. The method for manufacturing an SOI substrate according to claim 33, wherein the halogen is chlorine.

38. The method for manufacturing an SOI substrate according to claim 33, wherein oxygen is used as a gas used for the plasma treatment.

39. The method for manufacturing an SOI substrate according to claim 33, wherein the semiconductor substrate is a single crystal silicon substrate, a polycrystalline silicon substrate, or a solar-grade silicon substrate.

40. The method for manufacturing an SOI substrate according to claim 33, wherein the SOI substrate is incorporated in one selected from the group consisting of a phone, a camera, a game machine, and an audio reproducing device.

* * * * *